(12) United States Patent
Mitsugi et al.

(10) Patent No.: US 9,337,385 B2
(45) Date of Patent: May 10, 2016

(54) SEMICONDUCTOR LIGHT EMITTING ELEMENT AND METHOD FOR MANUFACTURING THE SAME

(71) Applicant: Kabushiki Kaisha Toshiba, Minato-ku (JP)

(72) Inventors: Satoshi Mitsugi, Kawasaki (JP); Shinji Yamada, Nonoichi (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/323,515

(22) Filed: Jul. 3, 2014

(65) Prior Publication Data

US 2015/0014626 A1    Jan. 15, 2015

(30) Foreign Application Priority Data

Jul. 9, 2013    (JP) .................................. 2013-143955

(51) Int. Cl.
*H01L 33/00*    (2010.01)
*H01L 33/22*    (2010.01)
(Continued)

(52) U.S. Cl.
CPC .............. *H01L 33/20* (2013.01); *H01L 33/005* (2013.01); *H01L 33/06* (2013.01); *H01L 33/22* (2013.01); *H01L 33/382* (2013.01)

(58) Field of Classification Search
CPC ....... H01L 33/005; H01L 33/06; H01L 33/20; H01L 33/22; H01L 33/382
USPC ................ 257/13, 76, 79, 95, 98, 99, E31.13, 257/E33.06, E33.024, E33.068, E33.074; 438/24, 29, 31, 33, 42, 46
See application file for complete search history.

(56) References Cited

U.S. PATENT DOCUMENTS 7,541,206 B2 *  6/2009  Yoon et al. ...................... 438/29
8,629,424 B2 *  1/2014  Zhu et al. ......................... 257/13
(Continued)

FOREIGN PATENT DOCUMENTS

JP      2005-5679       1/2005
JP      2005-158788     6/2005
(Continued)

OTHER PUBLICATIONS

I. Schnitzer, et al., "30% external quantum efficiency from surface textured, thin-film light-emitting diodes", Applied Physics Letters, vol. 63, No. 16, Oct. 18, 1993, pp. 2174-2176.

*Primary Examiner* — Dao H Nguyen
(74) *Attorney, Agent, or Firm* — Oblon, McClelland, Maier & Neustadt, L.L.P

(57) ABSTRACT

A semiconductor light emitting element includes a substrate and a stacked body. The stacked body is aligned with the substrate. The stacked body includes first and second semiconductor layers, a light emitting layer, and first and second electrodes. The first semiconductor layer has a first face including first and second portions. The first portion is provided with a plurality of convex portions. The second portion is aligned with the first portion. The second semiconductor layer is provided facing the second portion. The light emitting layer is provided between the second portion and the second semiconductor layer. The second semiconductor layer is disposed between the second electrode and the light emitting layer. An interval of each of the convex portions is no less than 0.5 times and no more than 4 times a wavelength of a light emitted from the light emitting layer.

20 Claims, 15 Drawing Sheets

(51) Int. Cl.
   *H01L 29/06*  (2006.01)
   *H01L 33/20*  (2010.01)
   *H01L 33/06*  (2010.01)
   *H01L 33/38*  (2010.01)

(56) References Cited

U.S. PATENT DOCUMENTS 9,012,933 B2 * 4/2015 Chi et al. .................. 257/94
9,054,285 B2 * 6/2015 Zhu et al. ................. 257/98

| | | | |
|---|---|---|---|
| 2004/0206969 | A1 | 10/2004 | Orita |
| 2005/0179130 | A1 | 8/2005 | Tanaka et al. |
| 2005/0221521 | A1 | 10/2005 | Lee et al. |
| 2010/0197055 | A1 | 8/2010 | Tanaka et al. |

FOREIGN PATENT DOCUMENTS

| JP | 2005-286291 | 10/2005 |
|---|---|---|
| JP | 2008-10894 | 1/2008 |
| JP | 4311173 | 8/2009 |
| JP | 2012-244165 | 12/2012 |

* cited by examiner

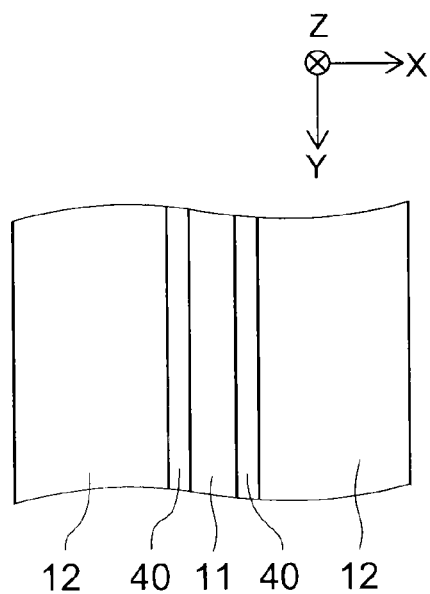
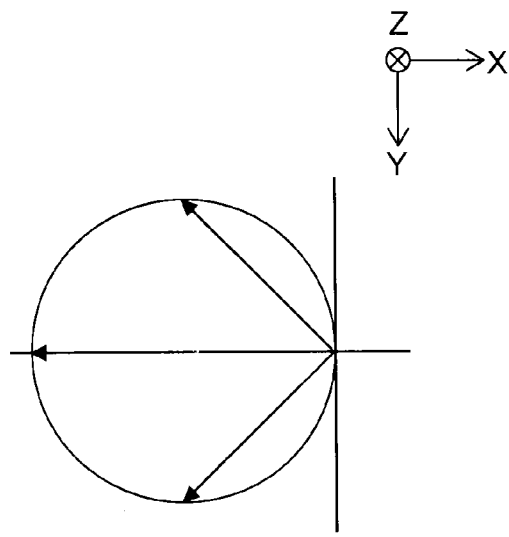
FIG. 7A  FIG. 7B
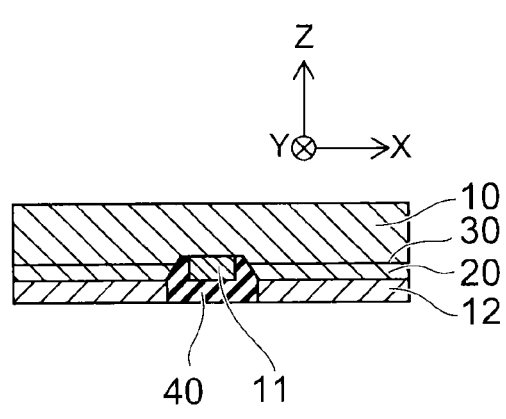
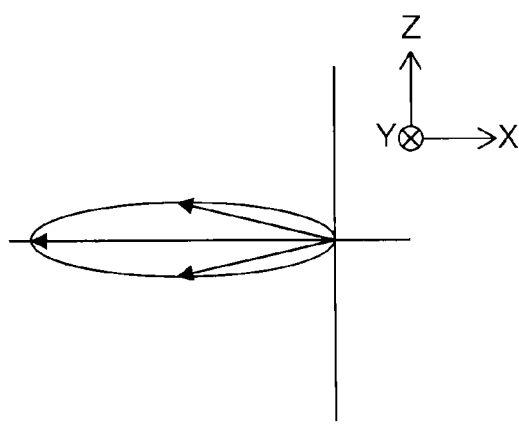
FIG. 7C  FIG. 7D

| | COMPLEX REFRACTIVE INDEX ($\lambda$=450NM) | |
|---|---|---|
| FIRST SEMICONDUCTOR | $2.475+0.00003581i$ | EQUIVALENT TO $\alpha=10\text{CM}^{-1}$ |
| SECOND SEMICONDUCTOR | $2.475+0.00007162i$ | ※FOR EQUIVALENT THICKNESS (2 TIMES) |
| LIGHT EMITTING LAYER 30 | $2.475+0.0003581i$ | EQUIVALENT TO $\alpha=10\text{CM}^{-1}$ |
| INSULATING LAYER 40 | 1.47 | |
| FIRST ELECTRODE 11 | $1.8+2.0i$ | EQUIVALENT TO 20% OF VERTICAL REFLECTANCE |
| SECOND ELECTRODE 12 | $0.104+2.499i$ | EQUIVALENT TO 92% OF VERTICAL REFLECTANCE |
| FIRST INTERMEDIATE LAYER 51 | $0.63+5.47i$ | |
| SECOND INTERMEDIATE LAYER 52 | $0.037+2.482i$ | |

FIG. 10

SEMICONDUCTOR LIGHT EMITTING ELEMENT AND METHOD FOR MANUFACTURING THE SAME

CROSS-REFERENCE TO RELATED APPLICATIONS

This application is based upon and claims the benefit of priority from Japanese Patent Application No. 2013-143955, filed on Jul. 9, 2013; the entire contents of which are incorporated herein by reference.

FIELD

Embodiments described herein relate generally to a semiconductor light emitting element and a method for manufacturing the same.

BACKGROUND

There are semiconductor light emitting elements such as light emitting diodes and laser diodes. Improvement of light extraction efficiency is desired in semiconductor light emitting elements.

BRIEF DESCRIPTION OF THE DRAWINGS

FIGS. 7A to 7D are schematic diagrams illustrating a light distribution of incident light on the joint surface of the first semiconductor layer and the first electrode;

FIG. 10 is a table showing a refractive index of each portion used in simulation;

DETAILED DESCRIPTION

Figure 1A:
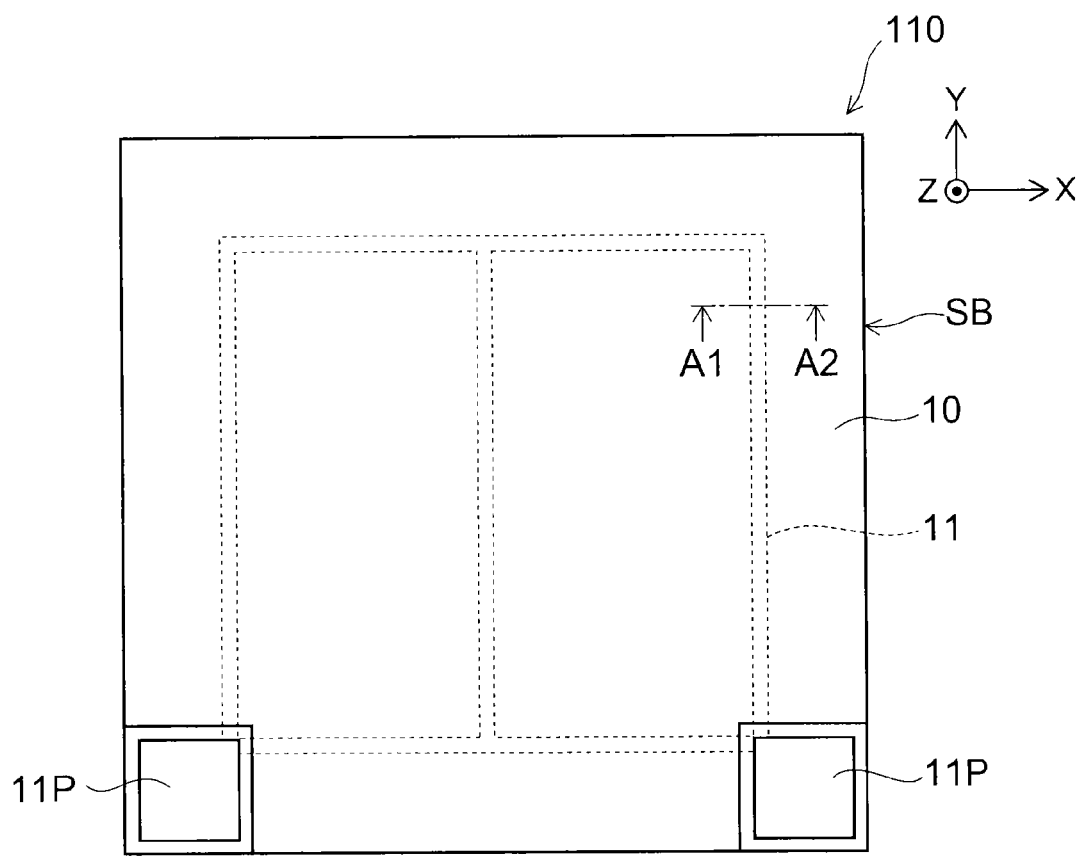
FIGS. 1A and 1B are schematic views illustrating a semiconductor light emitting element according to an embodiment.

According to one embodiment, a semiconductor light emitting element includes a substrate and a stacked body. The stacked body is aligned with the substrate in a first direction. The stacked body includes a first semiconductor layer, a second semiconductor layer, a light emitting layer, a first electrode, and a second electrode. The first semiconductor layer has a first face. The first face includes a first portion and a second portion. The first portion is provided with a plurality of convex portions. The second portion is aligned with the first portion in a second direction crossing the first direction. The first semiconductor layer is of a first conductivity type. The second semiconductor layer is provided facing the second portion. The second semiconductor layer is of a second conductivity type. The light emitting layer is provided between the second portion and the second semiconductor layer. The first electrode faces the first portion and electrically connected to the first semiconductor layer. The second electrode is electrically connected to the second semiconductor layer. The second semiconductor layer is disposed between the second electrode and the light emitting layer. An interval of each of the convex portions is no less than 0.5 times and no more than 4 times a wavelength of a light emitted from the light emitting layer.

According to another embodiment, a method is disclosed for manufacturing a semiconductor light emitting element. The method can include preparing a processed body. The processed body includes a growth substrate and a stacked film. The stacked film is stacked on the growth substrate in the first direction. The stacked film includes a first semiconductor film, a second semiconductor film and a light emitting film. The first semiconductor film is of a first conductivity type. The second semiconductor film is of a second conductivity type. The first semiconductor film is disposed between the substrate and the second semiconductor film. The light emitting film is provided between the first semiconductor film and the second semiconductor film. The method can include forming a groove and a plurality of convex portions. The groove exposes a portion of the first semiconductor film. The convex portions are provided on the portion of the first semiconductor film exposed by the groove. An interval of each of the convex portions is no less than 0.5 times and no more than 4 times a wavelength of a light emitted from the light emitting film. The method can include forming a first electrode electrically connected to the first semiconductor film on the portion of the first semiconductor film exposed by the groove. The method can include forming a second electrode electrically connected to the second semiconductor film on the second semiconductor film.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

Figure 1B:
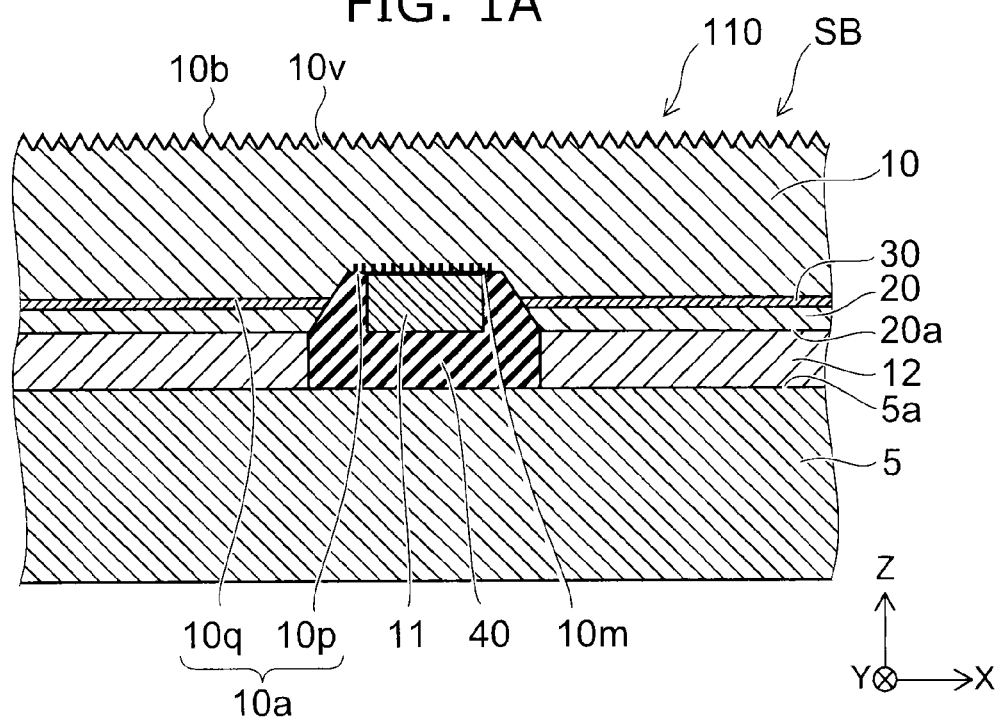

FIGS. 1A and 1B are schematic views illustrating a semiconductor light emitting element according to an embodiment.

FIG. 1A is a schematic plan view. FIG. 1B is a partial cross-sectional view schematically illustrating an A1-A2 line cross-section in FIG. 1A. FIG. 1B illustrates FIG. 1A further enlarged.

As illustrated in FIGS. 1A and 1B, a semiconductor light emitting element 110 according to this embodiment includes a substrate 5, and a stacked body SB.

The substrate 5 includes a major surface 5a. In this example, the substrate 5 is a rectangle. The shape of the substrate 5 is not limited to a rectangle, and may be any shape. The substrate 5 has, for example, conductivity and light reflectivity. For example, a silicon substrate is used for the substrate 5. The substrate 5 may be a metal substrate that includes Cu or the like. The substrate 5 may be a sapphire substrate or the like. The substrate 5 may have insulating properties. The substrate 5 may be optically transparent.

Here, one direction parallel to the major surface 5a is defined as the X-axis direction. A direction parallel to the major surface 5a and perpendicular to the X-axis direction is defined as the Y-axis direction. A direction perpendicular to the X-axis direction and the Y-axis direction is defined as the Z-axis direction. The Z-axis direction is a direction perpendicular to the major surface 5a.

The stacked body SB is aligned with the substrate 5 in the Z-axis direction (first direction). In this example, the stacked body SB is provided on the major surface 5a of the substrate 5. The stacked body SB includes, for example, a first semiconductor layer 10, a second semiconductor layer 20, a light emitting layer 30, a first electrode 11, and a second electrode 12.

The first semiconductor layer 10 includes a nitride semiconductor and is a first conductivity type. For example, the first conductivity type is an n-type and the second conductivity type is a p-type. The first conductivity type may be a p-type and the second conductivity type may be an n-type. Hereafter, a case in which the first conductivity type is an n-type, and the second conductivity type is a p-type will be described. For example, a GaN layer including n-type impurities is used for the first semiconductor layer 10. Si, for example, is used for the n-type impurity.

The first semiconductor layer 10 has a first face 10a and a second face 10b. The first face 10a has a first portion 10p and a second portion 10q. The second portion 10q is aligned with the first portion 10p in a second direction intersecting the Z-axis direction (first direction). The second portion 10q is aligned with the first portion 10p in, for example, the X-axis direction. A plurality of convex portions 10m are aligned and provided in the first portion 10p.

The second face 10b is a face on the opposite side of the first face 10a. An unevenness 10v is provided on the second face 10b. The second face 10b is, for example, roughened.

The second semiconductor layer 20 is provided facing the second portion 10q. The second semiconductor layer 20 includes a nitride semiconductor and is the second conductivity type. For example, a GaN layer including p-type impurities is used for the second semiconductor layer 20. Mg, for example, is used for the p-type impurity. The thickness of the second semiconductor layer 20 is thinner than the width of, for example, the first semiconductor layer 10. The thickness of the second semiconductor layer 20 may be equal to or greater than the thickness of the first semiconductor layer 10.

The light emitting layer 30 is provided between the second portion 10q and the second semiconductor layer 20. The Z-axis direction corresponds to a stacking direction of, for example, the first semiconductor layer 10, the second semiconductor layer 20, and the light emitting layer 30.

The light emitting layer 30 includes, for example, a nitride semiconductor. The light emitting layer 30 includes, for example, a plurality of barrier layers with well layers provided between the plurality of barrier layers. The barrier layers and well layers are stacked along the Z-axis direction. For example, a multi-quantum well (MQW) structure is used for the light emitting layer 30. A single-quantum well (SQW) structure may be used for the light emitting layer 30. For example, a GaN layer is used for the barrier layers. For example, an InGaN layer is used for the well layers. Voltage is applied between the first semiconductor layer 10 and the second semiconductor layer 20, and current flows to the light emitting layer 30. Therefore, light is emitted from the light emitting layer 30.

In the semiconductor light emitting element 110, the second face 10b of the first semiconductor layer 10 becomes a light extraction surface. As described above, the unevenness 10v is provided on the second face 10b. Therefore, all reflectivity of the second face 10b of the light emitted from the light emitting layer 30 is suppressed, and light extraction efficiency can be improved.

The first electrode 11 is provided facing the first portion 10p and is electrically connected to the first semiconductor layer 10. The first electrode 11 contacts, for example, the first portion 10p. The first electrode 11 contacts, for example, the plurality of convex portions 10m. By this, the first electrode 11 is electrically connected to the first semiconductor layer 10 via the first portion 10p. The first electrode 11 has reflectivity with respect to the light emitted from the light emitting layer 30. The reflectance of the first electrode 11 is higher than the reflectance of, for example, the first semiconductor layer 10. The first electrode 11 includes at least one of the following: Al, Ag, Pt, Ti, Ni, and Au, for example.

The first electrode 11 is a thin line extending in any direction parallel to the first face 10a (X-Y plane). The first electrode 11 extends in for example, a third direction crossing the first direction and the second direction. The first electrode 11 extends in, for example, the Y-axis direction. The width of a direction perpendicular to a extending direction of the first electrode 11 is for example, not less than 1 µm and not more than 20 µm. An area of the first electrode 11 corresponding to an area of the first face 10a is, for example, not less than 1% and not more than 30%.

The first electrode 11 is a frame shape along the outer edge of, for example, the first face 10a. In this example, the first electrode 11 includes a portion extending in the X-axis direction and a portion extending in the Y-axis direction. For example, in the portion extending in the Y-axis direction of the first electrode 11, the width of the X-axis direction is not less than 1 µm and not more than 20 µm.

A pad portion 11p is provided in the first electrode 11. The pad portion 11p is exposed from the first semiconductor layer 10. The pad portion 11p does not overlap the first semiconductor layer 10 when projected on the X-Y plane. The pad portion 11p is used, for example, in wiring of the first electrode 11 and an external member. In this example, two pad portions 11p are provided. The number of the pad portions 11p is not limited to two, and may be one or three. In the pad portion 11p, at least one of the following metals, or an alloy including at least one of the following metals is used, for example: Ti, Pt, Au, Al, Cu, and Sn.

The second electrode 12 is electrically connected to the second semiconductor layer 20. The second semiconductor layer 20 is disposed between the second electrode 12 and the light emitting layer 30. In this example, the second semiconductor layer 20 is provided between the first semiconductor layer 10 and the substrate 5, and the second electrode 12 is provided between the second semiconductor layer 20 and the substrate 5. In other words, the second electrode 12 is provided on the substrate 5, the second semiconductor layer 20 is provided on the second electrode 12, the light emitting layer 30 is provided on the second semiconductor layer 20, and the first semiconductor layer 10 is provided on the light emitting layer 30.

In this manner, in the semiconductor light emitting element 110, the second face 10b of the first semiconductor layer 10 becomes a light extraction surface, and the first electrode 11 and the second electrode 12 are provided on the first face 10a side opposite of the second face 10b. The semiconductor light emitting element 110 is a light emitting element with a so-called lateral-current-injection type thin film structure.

The second electrode 12 is electrically connected to the second semiconductor layer 20 by coming in contact with, for example, the second semiconductor layer 20. Further, the second electrode 12 is electrically connected to the substrate 5 via, for example, a soldering. In other words, the second semiconductor layer 20 is electrically connected to the substrate 5 via the second electrode 12.

The second electrode 12 has reflectivity with respect to the light emitted from, for example, the light emitting layer 30. The reflectance of the second electrode 12 is higher than the reflectance of, for example, the second semiconductor layer 20. In the second electrode 12, alloys of Ag and Al, or alloys that have these as the main components and the like are used. In this manner, a high reflectivity can be obtained in, for example, the second electrode 12. Furthermore, a transparent conductive layer with a thickness of λ/2 to 2λ may be included between the second semiconductor layer 20 and the metal or alloy. In other words, the second electrode 12 may include the metal or alloy, and a transparent conductive layer. Note that λ is the wavelength of the light emitted from the light emitting layer 30.

The second semiconductor layer 20 has an opposing surface 20a that faces the second electrode 12. The opposing surface 20a is a face that faces substantially the same direction as for example, the first face 10a. The second semiconductor layer 20 comes in contact with the second electrode 12 on, for example, the opposing surface 20a. The surface roughness of the opposing surface 20a is less than the surface roughness of, for example, the first portion 10p. The opposing surface 20a is a substantially smooth face. Therefore, the absorption of the light in, for example, the second electrode 12, can be suppressed. For example, the light extraction efficiency can be improved.

The stacked body SB further includes, for example, an insulating layer 40. The insulating layer 40 is provided between the first electrode 11 and the second semiconductor layer 20, between the first electrode 11 and the light emitting layer 30, between the first electrode 11 and the second electrode 12, and between the first electrode 11 and the substrate 5. The insulating layer 40 electrically insulates, for example, the first electrode 11 and the second semiconductor layer 20. The insulating layer 40 electrically insulates, for example, the first electrode 11 and the light emitting layer 30. The insulating layer 40 electrically insulates, for example, the first electrode 11 and the second electrode 12. The insulating layer 40 electrically insulates, for example, the first electrode 11 and the substrate 5. In other words, the insulating layer 40 suppresses a short circuit of the first semiconductor layer 10 and the second semiconductor layer 20. In the insulating layer 40, at least one of the following is used, for example: silicon dioxide film, a silicon nitride film, and a silicon oxynitride. The insulating layer 40 may be various fluorides, a transparent resin, an oxide other than Si or the like. A refractive index of the insulating layer 40 is lower than a refractive index of GaN or a refractive index of SiN. The refractive index of the insulating layer 40 is the lower the better. In addition, the insulating layer 40 is optical transparency. For example, the insulating layer 40 may be LiF, CaF, $Al_2O_3$, MgO, $Y_2O_3$ or the like.

Further, in this example, one portion of the insulating layer 40 faces the first portion 10p in the Z-axis direction. One portion of an insulating portion 40 contacts, for example, the first portion 10p. One portion of the insulating portion 40 contacts, for example, the plurality of convex portions 10m.

Figure 2A:
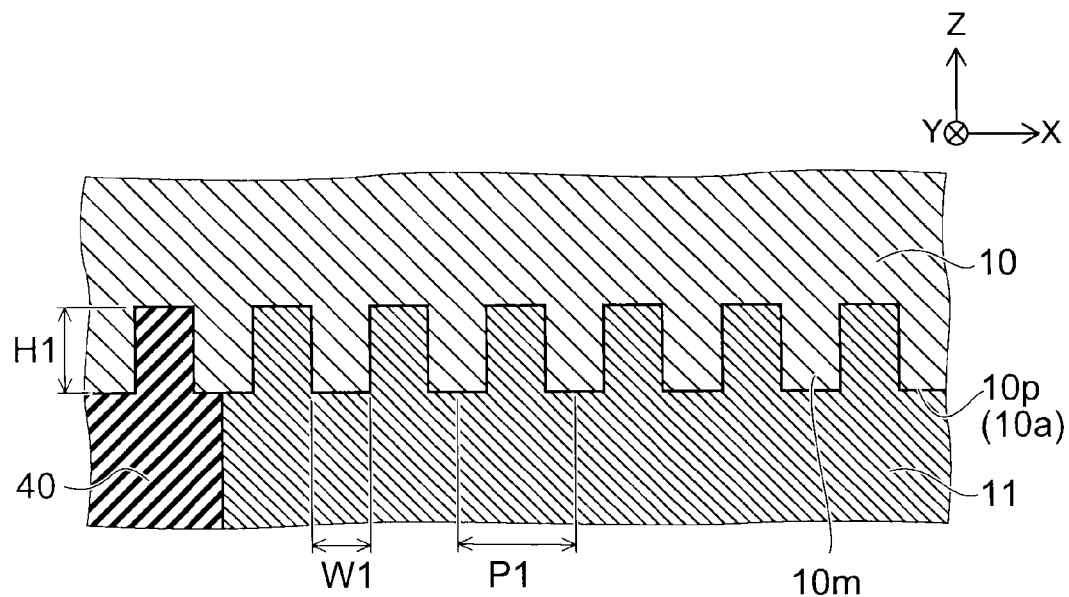
FIGS. 2A and 2B are schematic views illustrating one portion of a semiconductor light emitting element according to the embodiment.
Figure 2B:
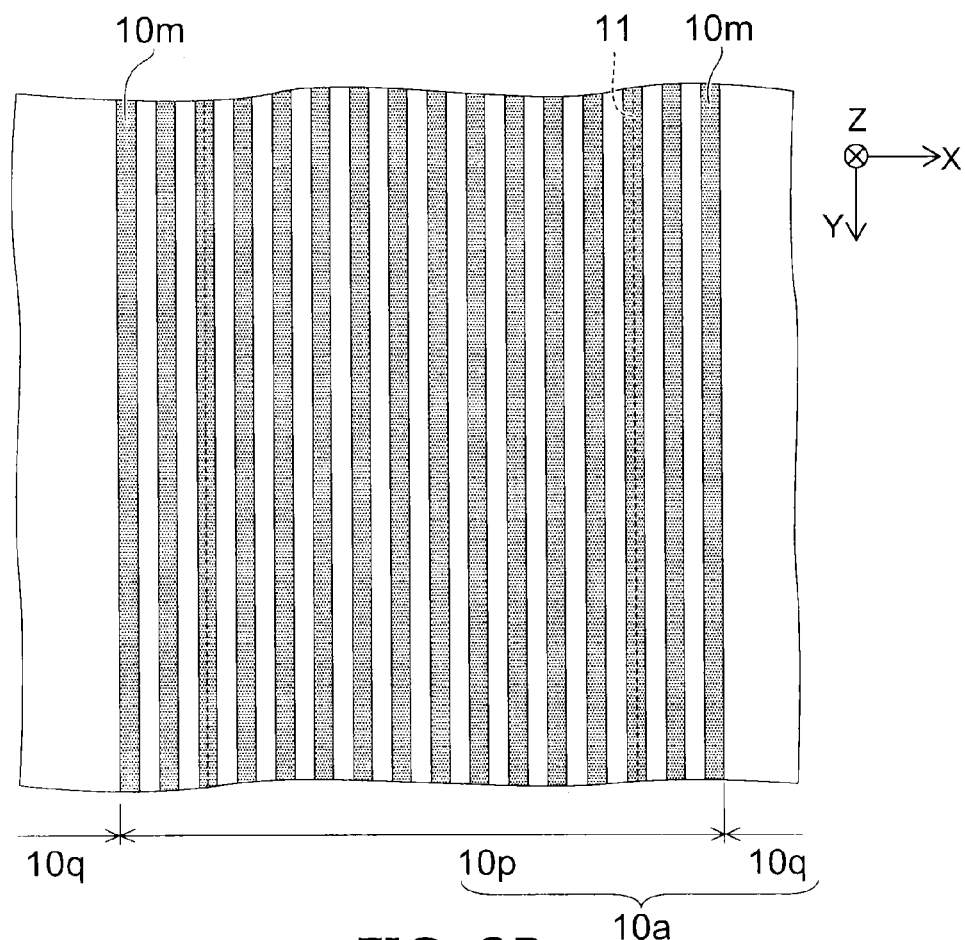

FIGS. 2A and 2B are schematic views illustrating one portion of a semiconductor light emitting element according to the embodiment.

FIG. 2A is a partial cross-sectional view schematically illustrating one enlarged portion of the first semiconductor layer 10 and one enlarged portion of the first electrode 11. FIG. 2B is a partial plan view schematically illustrating one enlarged portion of the first semiconductor layer 10 when viewed from the substrate 5 side.

As illustrated in FIGS. 2A and 2B, each of the plurality of convex portions 10m of the first semiconductor layer 10 is, for example, arranged in the X-axis direction extending in the Y-axis direction. Each of the plurality of convex portions 10m extend, for example, in the extending direction (third direction) of the first electrode 11. Each of the plurality of convex portions 10m is arranged, for example, in a direction where the first portion 10p and the second portion 10q are arranged. In other words, in this example, each of the plurality of convex portions 10m is a thin line that extends in a direction substantially parallel to the first electrode 11.

An interval P1 of each of the plurality of convex portions 10m is, for example, not less than 0.5 times and not more than 4 times the wavelength of the light emitted from the light emitting layer 30. The wavelength of the light emitted from the light emitting layer 30 is, for example, 450 nm (not less than 400 nm and not greater than 500 nm), and in this case, the interval P1 is not less than 225 nm and not greater than 1800 nm. In this example, the interval P1 is more specifically the distance of the X-axis direction between the centers of the X-axis direction of the two adjacent convex portions 10m.

A width W1 (length of the X-axis direction) of each of the plurality of convex portions 10m is, for example, not less than 10% and not more than 90% of the interval P1. Further, a height H1 (length of the Z-axis direction) of each of the plurality of convex portions 10m is, for example, not less than 100 nm and not greater than 1 μm. Further, in this example, each of the plurality of convex portions 10m has a rectangular cross-section on the X-Z plane. The cross-section of the convex portions 10m is not limited to a rectangular shape, but may be any shape. The cross-section of the convex portions 10m may be, for example, triangle-shaped, trapezoidal-shaped, and semielliptical-shaped.

The plurality of convex portions 10m forms a diffraction grating on the first portion 10p. The plurality of convex portions 10m forms a diffraction grating on, for example, a joint interface of the first semiconductor layer 10 and the first electrode 11. In this example, the plurality of convex portions 10m are a so-called one dimensional diffraction grating. The number of convex portions 10m arranged in the X-axis direction is, for example, eight or more.

That is to say, the plurality of convex portions 10m forms at least 8 repeated periodic diffraction gratings.

The plurality of convex portions 10m vary depending on the diffraction of a travel direction of the light emitted from the light emitting layer 30. The plurality of convex portions 10m, for example, change the travel direction of the light that is emitted from the light emitting layer 30 and is incident to the first portion 10p along a direction substantially parallel to the X-Y plane. The plurality of convex portions 10m, for example, change the travel direction of the light advancing in a direction substantially parallel to the X-Y plane and is directed towards the second face 10b, which is a light extraction surface.

In this manner, light extraction efficiency can be improved in the semiconductor light emitting element 110 according to this embodiment. Further, in this example, the plurality of convex portions 10m form a diffraction grating also on a joint interface of the first semiconductor layer 10 and the insulating layer 40. In this manner, for example, light extraction efficiency can be further improved. Note that, it is not always necessary for the convex portions 10m to contact the insulating layer 40. In other words, the diffraction grating must be provided at least near to the joint interface of the first semiconductor layer 10 and the first semiconductor layer 11.

Furthermore, in this example, each of the plurality of convex portions 10m includes the same materials as the first semiconductor layer 10. The materials of each of the plurality of convex portions 10m is the same as the materials of the first semiconductor layer 10. In other words, in this example, each of the plurality of convex portions 10m is integrated with the first semiconductor layer 10. Each of the plurality of convex portions 10m is an uneven shape formed on the first face 10a itself.

As described above, the first electrode 11 contacts the plurality of convex portions 10m. By this, for example, a contact area of the first semiconductor layer 10 and the first electrode 11 is increased, and the contact resistance of the first semiconductor layer 10 and the first electrode 11 can be suppressed.

Figure 3A:
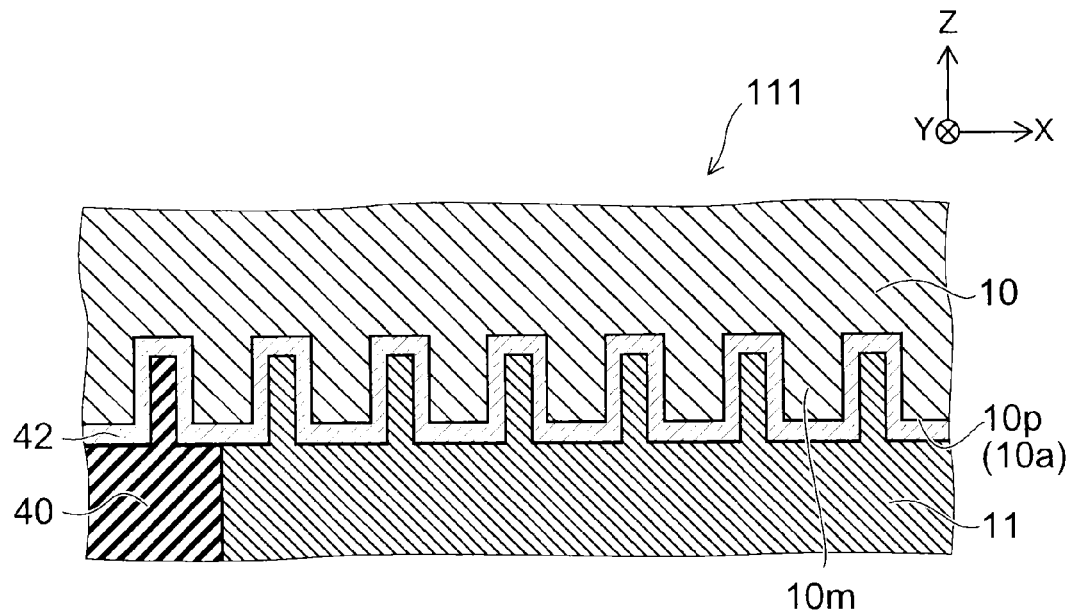
FIGS. 3A and 3B are cross-sectional views schematically illustrating another semiconductor light emitting element according to the embodiment.
Figure 3B:
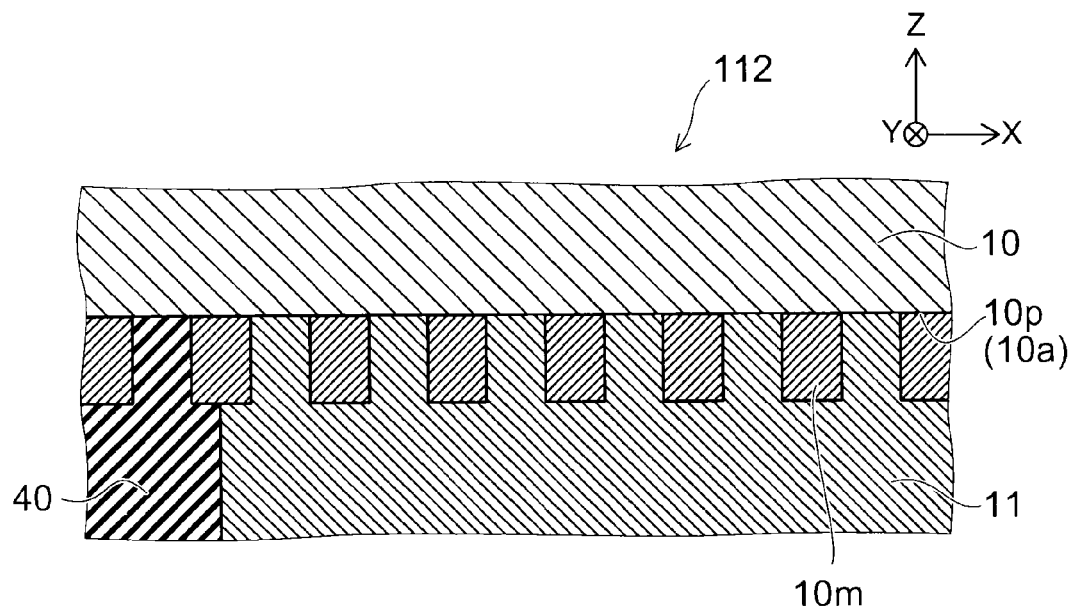

FIGS. 3A and 3B are cross-sectional views schematically illustrating another semiconductor light emitting element according to the embodiment.

As illustrated in FIG. 3A, in a semiconductor light emitting element 111, the stacked body SB further includes a conductive layer 42. The conductive layer 42 is provided between the first semiconductor layer 10 and the first electrode 11. In this manner, the first electrode 11 may be electrically connected to the first semiconductor layer 10 via the conductive layer 42. The first electrode 11 does not always have to contact the plurality of convex portions 10m. In this example, the conductive layer 42 extends between the first semiconductor layer 10 and the insulating layer 40. Therefore, the conductive layer 40 does not always have to contact the plurality of convex portions 10m. The conductive layer 42 has, for example, optical transparency. The conductive layer 42 is, for example, transparent. In the conductive layer 42, for example, ITO or the like is used. Note that the conductive layer 42 may be light reflective.

As illustrated in FIG. 3B, in a semiconductor light emitting element 112, the materials of each of the plurality of convex portions 10m is different from the materials of the first semiconductor layer 10. Therefore, each of the plurality of convex portions 10m may be an uneven shape formed with other materials on the first face 10a. In this case, a material that is optically transparent is used in each of the plurality of convex portions 10m. Further, in this case, a refractive index of each of the plurality of convex portions 10m is made lower than a refractive index of the first semiconductor layer 10. In this manner, for example, a favorable light extraction efficiency can be achieved. In each of the plurality of convex portions 10m, for example, AlGaN, InGaN, or the like is used.

Figure 4A:
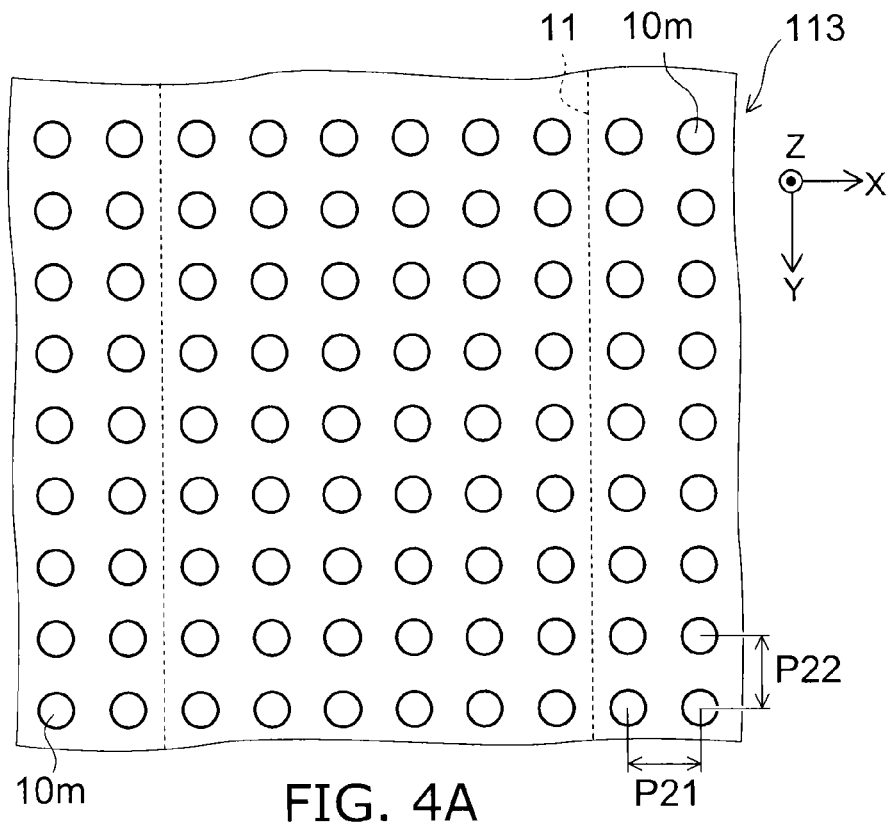
FIGS. 4A and 4B are cross-sectional views schematically illustrating another semiconductor light emitting element according to the embodiment.
Figure 4B:
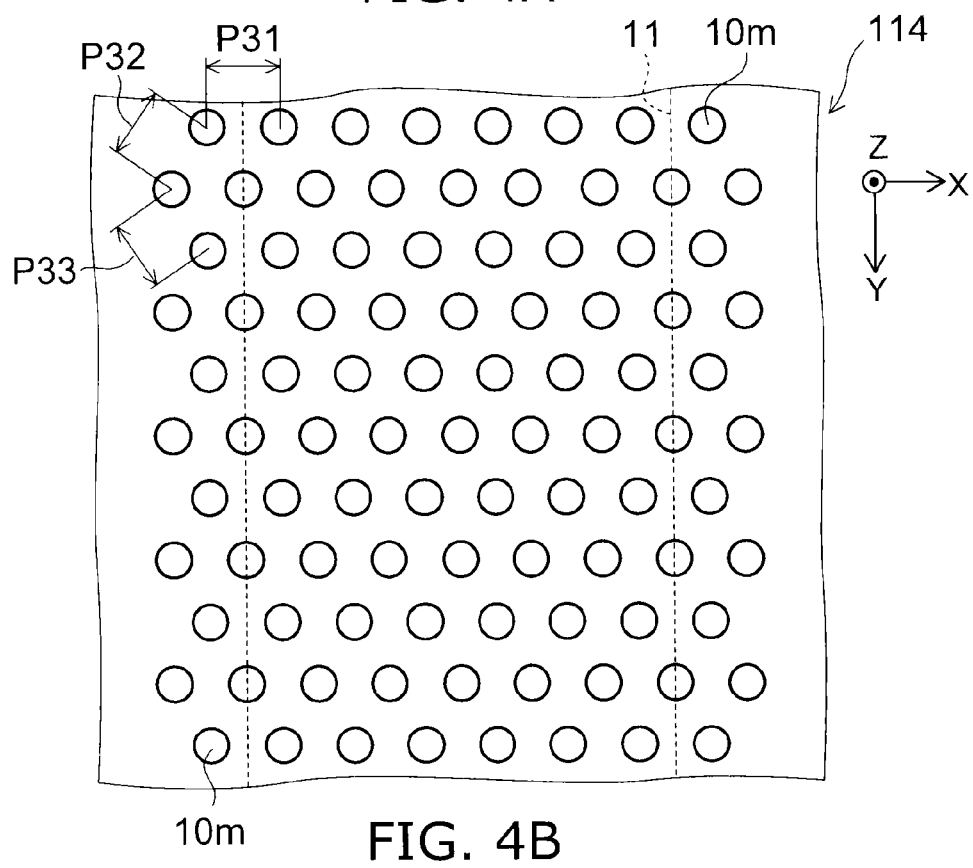

FIGS. 4A and 4B are cross-sectional views schematically illustrating another semiconductor light emitting element according to the embodiment.

As illustrated in FIG. 4A, in a semiconductor light emitting element 113, the plurality of convex portions 10m are aligned in square lattice in the X-axis direction and the Y-axis direction.

As illustrated in FIG. 4B, in a semiconductor light emitting element 114, the plurality of convex portions 10m are aligned in triangular lattice.

With the semiconductor light emitting elements 113 and 114, each of the plurality of convex portions 10m is island-shaped (dot shaped). In this manner, each of the plurality of island-shaped convex portions 10m may be provided aligned in a lattice shape on the first portion 10p. In other words, the diffraction grating provided on the first portion 10p is not limited to a one dimensional diffraction grating, but may be a two dimensional diffraction grating.

In the semiconductor light emitting element 113, each of intervals P21 and P22 of each of the plurality of convex portions 10m are made no less than 0.5 times and no more than 4 times the wavelength of the light emitted from the light emitting layer 30. In the semiconductor light emitting element 114, each of intervals P31, P32, and P33 of each of the plurality of convex portions 10m are made no less than 0.5 times and no more than 4 times the wavelength of the light emitted from the light emitting layer 30. Therefore, the travel direction of the light in the first portion 10p can be changed even with the semiconductor light emitting elements 113 and 114.

When forming a two dimensional diffraction grating, the number of convex portions 10m arranged in the X-axis direction is, for example, eight or more. That is to say, the plurality of convex portions 10m form at least eight or more repeated periodic two dimensional diffraction gratings.

Further, with a one dimensional diffraction grating, the degree of diffraction of the light incident from a direction parallel to a direction in which the lattice extends is less than the degree of diffraction of the light incident from a direction perpendicular to the direction in which the lattice extends. For example, in the example illustrated in FIG. 2B, the degree of diffraction of the light entering from the Y-axis direction is less than the degree of diffraction of the light entering from the X-axis direction.

Conversely, in a two dimensional diffraction grating, light incident from any direction parallel to the X-Y plane can be appropriately diffracted. Therefore, light extraction efficiency can be improved more in the semiconductor light emitting elements 113 and 114 in comparison to the semiconductor light emitting element 110.

Note that the disposal of the lattice of the plurality of convex portions 10m is not limited to a square lattice or a triangular lattice, but may be any disposal capable of providing a two dimensional diffraction grating to the first portion 10p. Further, the shape projecting the convex portions 10m on the X-Y plane in the semiconductor light emitting elements 113 and 114 is circular. The shape projecting the island-shaped convex portions 10m on the X-Y plane is not limited to a circle, but may be, for example, a polygon. The shape in which the island shaped convex portions 10m are projected on the X-Y plane may be any shape capable of providing a two dimensional diffraction grating to the first portion 10p.

Figure 5:
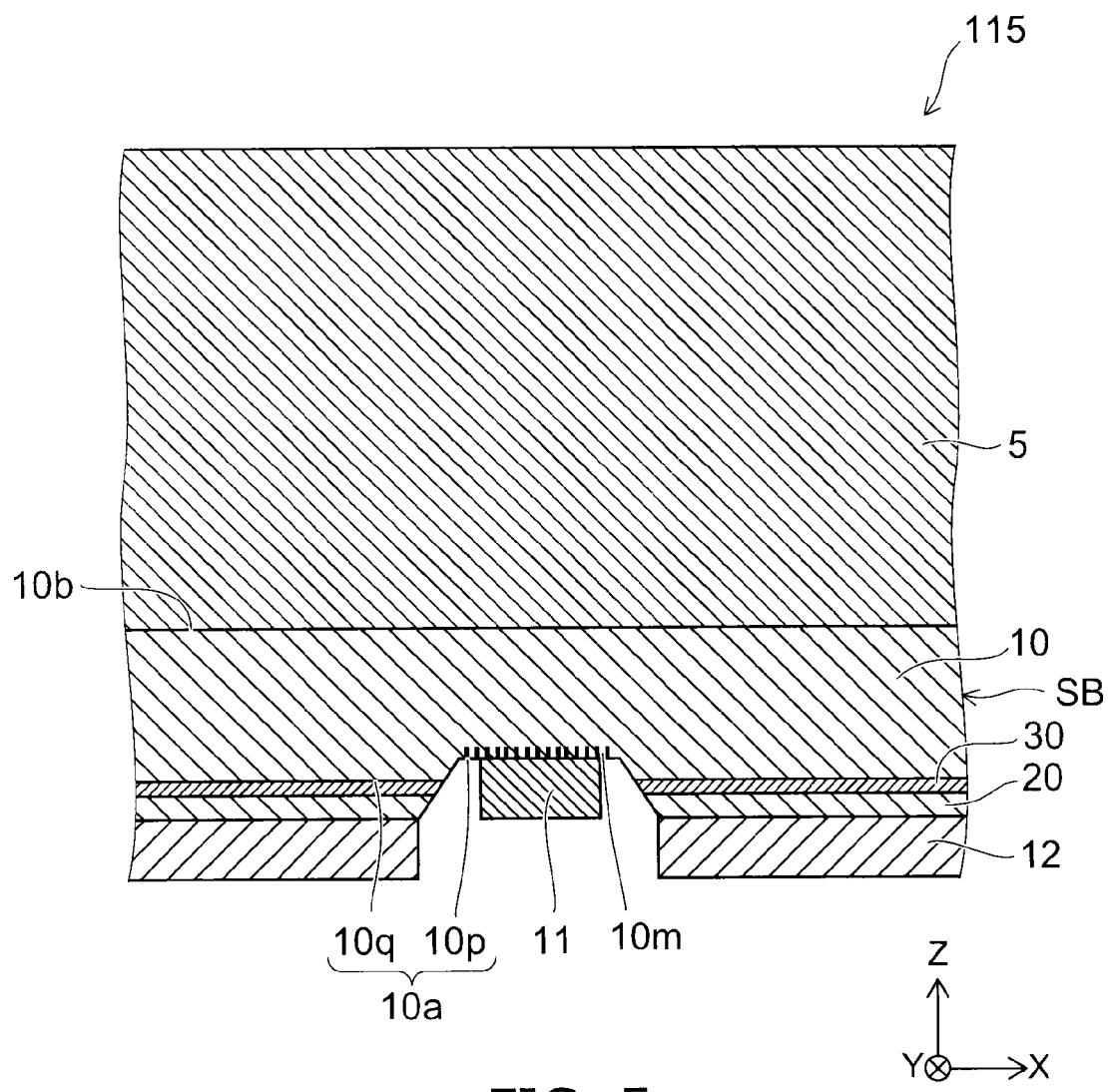
FIG. 5 is a cross-sectional view schematically illustrating another semiconductor light emitting element according to the embodiment.

FIG. 5 is a cross-sectional view schematically illustrating another semiconductor light emitting element according to the embodiment.

As illustrated in FIG. 5, in a semiconductor light emitting element 115, the first semiconductor layer 10 is provided between the substrate 5 and the light emitting layer 30. In the semiconductor light emitting layer 115, the second semiconductor layer 20 is provided on the second electrode 12, the light emitting layer 30 is provided on the second semiconductor layer 20, the first semiconductor layer 10 is provided on the light emitting layer 30, and the substrate 5 is provided on the first semiconductor layer 10.

With the semiconductor light emitting element 115, the stacked body SB is substantially the same as in the semiconductor light emitting element 110, and a detailed description will be omitted. In the semiconductor light emitting element 115, the substrate 5 is optically transparent. The substrate 5 is, for example, transparent. A sapphire substrate, for example, is used for the substrate 5. The light emitted from the light emitting layer 30 is emitted to the outside through the first semiconductor layer 10 and the substrate 5.

The semiconductor light emitting element 115 is a light emitting element with a so-called flip chip structure. Even with a flip chip structure, the second face 10b of the first semiconductor layer 10 becomes a light extraction surface, and the first electrode 11 and the second electrode 12 are provided on the first face 10a side opposite the second face 10b. Therefore, by providing the plurality of convex portions 10m (diffraction grating) on the first portion 10p, light extraction efficiency can be improved in the semiconductor light emitting element 115 just as in the semiconductor light emitting element 110.

For example, in the thin film structured semiconductor light emitting element, the second electrode (p electrode) is substantially smooth. The second electrode functions as, for example, a reflector. Then, an uneven structure is provided on the light extraction surface, and a light extraction process is performed in which light gradually escapes while reflection and scattering are repeated between the light extraction surface and the p electrode.

The element size of the thin film structure element is, for example, several hundred μm. In contrast, the thickness of the first semiconductor layer (length in the Z-axis direction) is approximately from 1 μm to 8 μm. The first semiconductor layer is, for example, a slab shape. Therefore, light emitted in a direction parallel to the X-Y plane (in-plane direction) and light scattered by the light extraction surface that becomes a propagation direction near the in-plane direction propagates inside the first semiconductor layer after losing almost all opportunities for scattering afterwards. As a result, the light distribution from the light propagation in the first semiconductor layer becomes a distribution biased to the in-plane direction. These components contribute little to the light extraction.

Next, a calculation example will be described. For simplification, the calculation model uses a two dimensional space of a cross-section of the first semiconductor layer (for example, a cross-section parallel to the X-Z plane), and the light extraction surface is assumed to be an ideal Lambert reflective surface. The light generated by the light emitting layer is isotropic. The width of the light emitting layer is 200 μm. The first electrode (n electrode) is made to be separated 10 μm from the terminal of the light emitting layer on a direction parallel to the X-Y plane.

When making the first electrode and the end of the opposite side a starting end of the light emitting layer, light distribution on the starting end is $1_{\theta,0}=a_\theta$. Here, $a_\theta$ represents the light distribution of the emitted light. Here, it is assumed $a_\theta=1$. Further, if the light distribution separated x from the starting end is made to be $1_{\theta,x}$, in the position $x+\Delta x$, it can be expressed as formula (1). Note that outside of the light emitting layer is made to be formula (2).

$$I_{\theta,x+\Delta x} = \alpha_\theta \cdot I_{0,x} + \int_\theta \beta_\theta \cdot I_{\theta,x} + \alpha_\theta \quad \text{[Formula 1]}$$

$$I_{\theta,x+\Delta x} = \alpha_\theta \cdot I_{\theta,x} + \int_\theta \beta_\theta \cdot I_{\theta,x} \quad \text{[Formula 2]}$$

Here, $\alpha_0$ is expressed by formula (3), $\beta_\theta$ is expressed by formula (4), and $\gamma_\theta$ is expressed by formula (5).

$$\alpha_\theta = \gamma_\theta \cdot (\sin\theta)^{\frac{\Delta x}{d}\tan\theta} \quad \text{[Formula 3]}$$

$$\beta_\theta = \gamma_\theta \cdot \left\{1 - (\sin\theta)^{\frac{\Delta x}{d}\tan\theta}\right\} \cdot R_\theta \sin\theta \quad \text{[Formula 4]}$$

$$\gamma_\theta = \exp\{-\Delta x \sqrt{1+\tan^2\theta} \cdot \alpha_{GaN}\} \cdot R_\theta \sin\theta \quad \text{[Formula 5]}$$

In each of the formulas (3) to (5), a variable d is the thickness of the first semiconductor layer, $R_\theta$ is the reflectance of the light extraction surface, and $\alpha_{GAN}$ is the light absorption of the first semiconductor layer. In the calculations, d=4 μm, $R_\theta$=70% (const.), and $\alpha_{GAN}$=20 cm$^{-1}$.

Figure 6A:
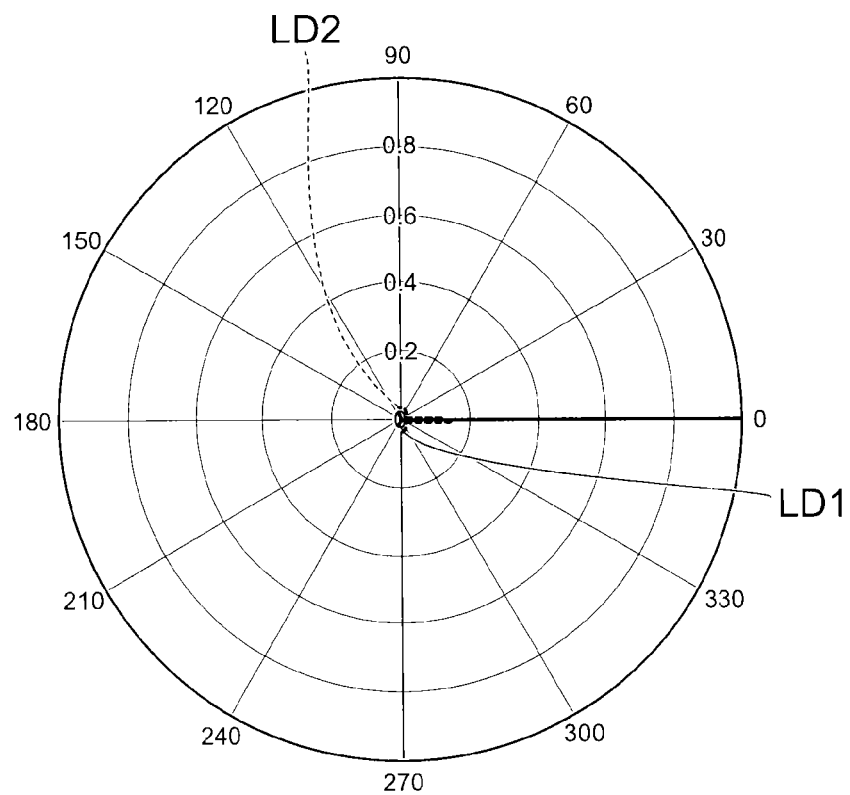
FIGS. 6A and 6B are schematic views illustrating one example of a calculation result of a semiconductor light emitting element according to the embodiment.
Figure 6B:
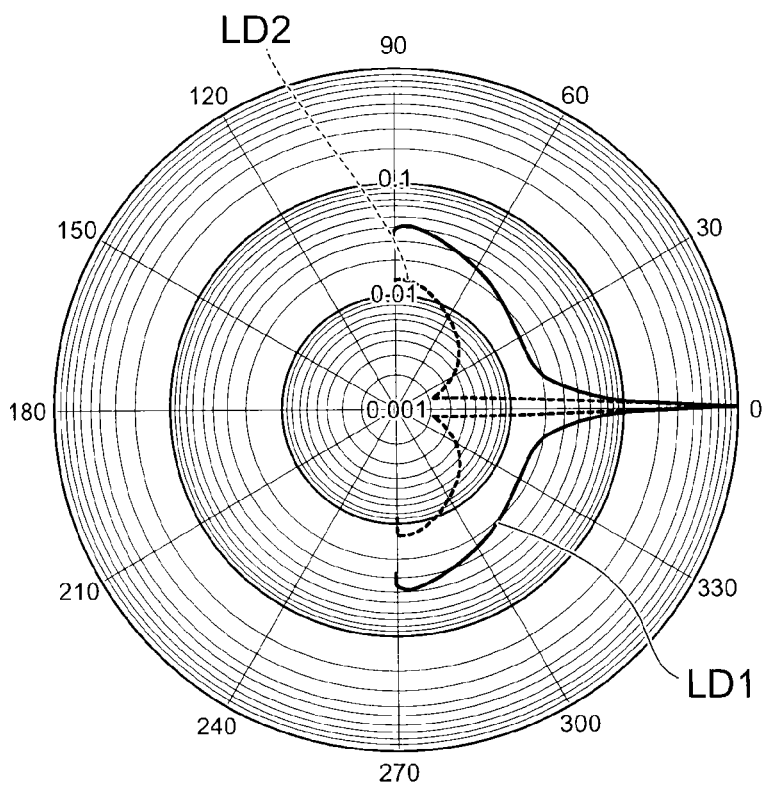

FIGS. 6A and 6B are schematic views illustrating one example of a calculation result of a semiconductor light emitting element according to the embodiment.

In FIGS. 6A and 6B, a light distribution LD1 on a light emitting layer terminal of the internal propagation light of the first semiconductor layer and a light distribution LD2 on a first electrode terminal of the internal propagation light of the first semiconductor layer are illustrated. FIG. 6A illustrates the light distribution linearly, and FIG. 6B illustrates the light distribution in a Log.

Because these calculations are two dimensional approximations, they cannot be used as is for three dimensions, but in any case it is estimated that the internal propagation light of the first semiconductor layer is excessively distributed in the horizontal direction in the vicinity of the first electrode.

Note that in flip chip structures, a substrate is connected to a light extraction surface. Therefore, the light distribution of a flip chip structure differs slightly from the light distribution of a thin film structure. For example, in a flip chip structure, when using a sapphire substrate, because the sapphire substrate has a lower refractive index than the first semiconductor layer, the internal propagation light excessively distributes light in the horizontal direction in the vicinity of the first electrode. Meanwhile, in a flip chip structure, the extreme light distribution described above is suppressed when a SiC substrate and a GaN substrate is used.

With the semiconductor light emitting element 110 with a thin film structure, the first electrode is provided on a face of the opposite side of the light extraction surface of the first semiconductor layer. On a substrate face side of the first semiconductor layer, the mesa shaped first electrode protected by the insulating layer is disposed going through the light emitting layer. Therefore, a joint surface of the first electrode and the first semiconductor layer (referred to below as the first contact face) is in a position closer to the light extraction surface than the light emitting layer. Next, the light emitting layer is laterally below the first contact face.

FIGS. 7A to 7D are schematic diagrams illustrating a light distribution of incident light on the joint surface of the first semiconductor layer and the first electrode.

FIGS. 7A and 7B schematically illustrate a light distribution of a direction parallel to the X-Y plane of the light incident to the first contact face.

FIGS. 7C and 7D schematically illustrate a light distribution of a direction parallel to the X-Z plane of the light incident to the first contact face.

From the conditions described above, as illustrated in FIGS. 7B and 7D, most of the light incident to the first contact face contributes almost nothing to light extraction because the orientation of the wave vector is estimated to be in a direction generally parallel to the first semiconductor layer.

At first, it may be thought that light extraction efficiency improves if the first contact face has an uneven structure. However, in actuality, it cannot be said that the optical characteristics of the first contact face are favorable. In this case, instead of improving the light efficiency by scattering and reflecting by the uneven structure, there are times when light absorption in the first electrode caused by the increase of surface area of the first electrode is dominant, and the total light extraction efficiency is reduced. To suppress this problem, the first contact face of the semiconductor light emitting element is made as smooth as possible to suppress light absorption loss in the first electrode.

This embodiment, takes advantage of the fact that a wave vector distribution of the light incident to the first electrode 11 is nearly parallel to the first contact face as described above. A design provides the diffraction grating structure on the first portion 10p so that reflected light (1~2 order diffracted light) is mostly perpendicular to the light extraction surface (second face 10b). In other words, the plurality of convex portions 10m are provided on a portion facing the first electrode 11 on the first semiconductor layer 10 and a portion facing the insulating region (insulating layer 40) around the first electrode 11. In this manner, light extraction is promoted. In addition, when compared with providing a diffraction grating structure on only the insulation region around the first electrodell, providing a diffraction grating structure on the first electrode 11, not only increases light absorption and promotes light extraction, but also increases the surface area of the first contact face, and effects such as a decrease in electrical resistance value can be achieved.

As described above, the light incident to the electrode 11 comes from the lateral direction. Therefore, a median of the propagation seen from the upper side of the first semiconductor layer 10 becomes a direction perpendicular to the extending direction of the thin line first electrode 11. Therefore, when the diffraction grating is a one dimensional structure, it is desirable to make it a thin line structured diffraction grating (convex portion 10m) extending in a direction parallel to the first electrode 11. Further, it may be a two dimensional diffraction grating structure, but in general it has the same design as a two dimensional slab photonic crystal.

The diffraction grating structure described above is provided on the first semiconductor layer 10 which has a high refractive index. Therefore, it is highly effective when an uneven height (the length of the Z-axis direction of the convex portion 10m) is greater than or equal to ¼ of an emission wavelength and is sufficient at ½ of the wavelength. That is to say, with an emission wavelength of 450 nm, it is desirable to have 45 nm or greater, and is more desirable to have 95 nm or greater.

In actuality, light incident to the first electrode 11, seen from the first contact face as illustrated in FIG. 7A, becomes a distribution resembling a Lambert type light distribution, and has a large value (maximum value of ½) within a range of 60 degrees perpendicular to a longitudinal direction of the first electrode 11. Therefore, it is desirable, for example, to design the diffraction grating so that it is optimal at an angle of incidence from 0 degrees to 60 degrees, particularly 15 degrees to 45 degrees.

Considering the above, it can be said that it is suitable for a structural cycle $\Lambda$ of the diffraction grating described above with respect to an emission wavelength $\lambda$ to be $\Lambda=\frac{1}{2}\lambda\sim4\lambda$, and more desirable if $\Lambda=\lambda\sim2\lambda$. In other words, the intervals P1 (P21, P22, P31, P32, and P33) of each of the plurality of convex portions 10m are no less than 0.5 times and no more than 4 times the wavelength of the light emitted from the light emitting layer 30. By this, light extraction efficiency can be improved. Then, the intervals P1 (P21, P22, P31, P32, and P33) are set to no less than 1 time and no more than 2 times the wavelength of the light emitted from the light emitting layer 30. By this, light extraction efficiency can be further improved.

Figure 8A:
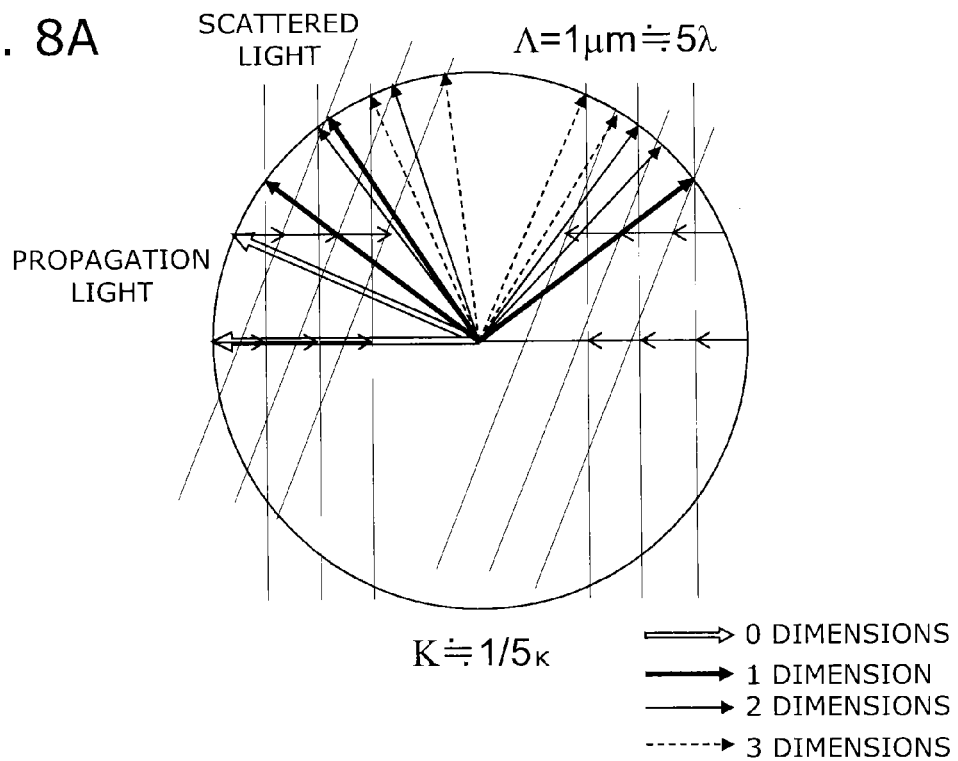
FIGS. 8A and 8B are schematic views illustrating one example of a calculation result of a semiconductor light emitting element according to the embodiment.
Figure 8B:
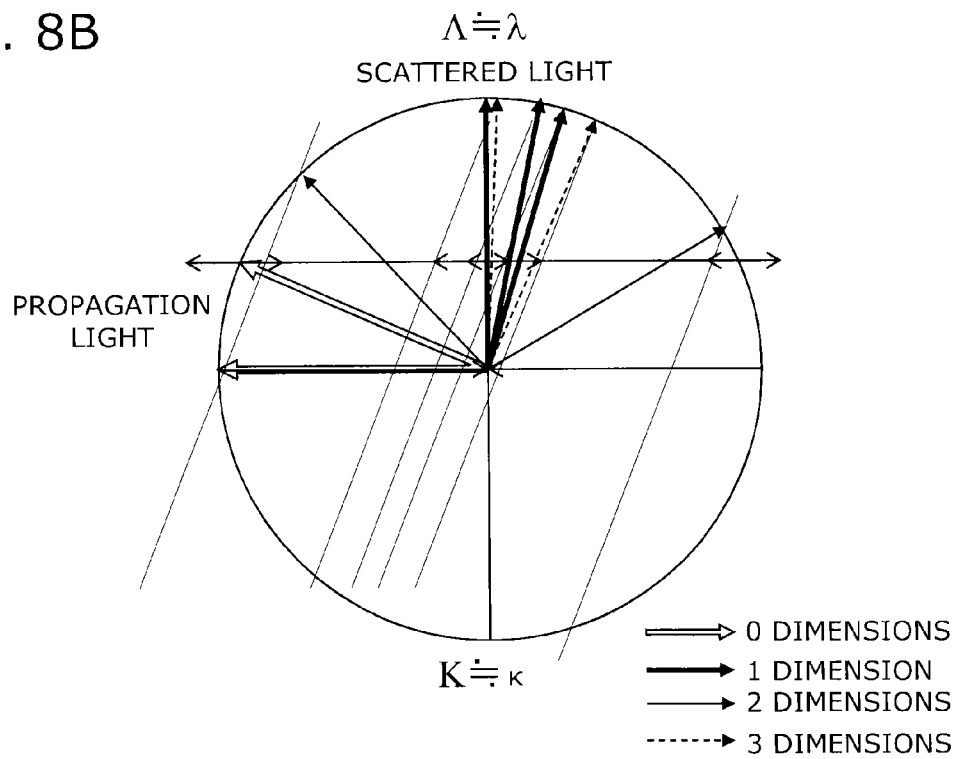

FIGS. 8A and 8B are schematic views illustrating one example of a calculation result of a semiconductor light emitting element according to the embodiment.

FIGS. 8A and 8B are conceptual diagrams of a light distribution of the light scattered by periodic unevenness using an Ewald sphere. FIG. 8A is a conceptual diagram of when $\Lambda=5\lambda$, and FIG. 8B is a conceptual diagram of when $\Lambda=\lambda$. In other words, FIG. 8A is a conceptual diagram of when the structural cycle A of the diffraction grating is enlarged, and FIG. 8B is a conceptual diagram of when the structural cycle A of the diffraction grating is reduced.

For example, in the case of a blue LED using a nitride semiconductor, wavelength $\lambda=450$ nm, the first semiconductor layer 10 is an n-type GaN layer, and the refractive index of the first semiconductor layer 10 of a 450 nm wavelength is 2.47. In this case, it is desirable if the structural cycle $\Lambda$ of the diffraction grating is, for example, no less than 180 nm and no more than 730 nm, and more desirable if it is no less than 180 nm and no more than 360 nm. Similarly, when the wavelength is 550 nm, and the refractive index of the first semiconductor layer 10 is 2.4, it is desirable for the structural cycle A of the diffraction grating to be no less than 230 nm and no greater than 460 nm.

As illustrated in FIG. 8A, when the structural cycle $\Lambda$ of the diffraction grating is enlarged (for example, when $\Lambda=5\lambda$), because the propagation angle does not greatly change, there is no large difference in a light scattering of the normal unevenness. Therefore, for example, a thin film structure like that of the semiconductor light emitting element 110 is not desirable for the reasons described above regarding light absorption.

Next, a simulation of behavior of the light around the first electrode of the semiconductor light emitting element according to an embodiment will be described.

Figure 9:
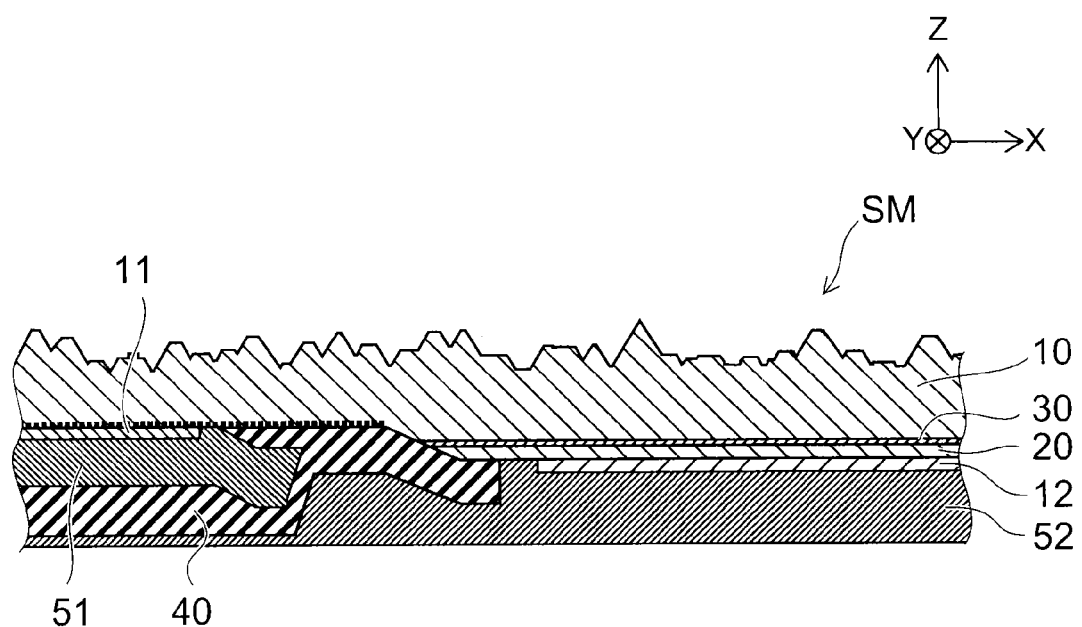
FIG. 9 is a cross-sectional view schematically illustrating a model of a semiconductor light emitting element used in a simulation.

FIG. 9 is a cross-sectional view schematically illustrating a model of a semiconductor light emitting element used in a simulation.

FIG. 10 is a table showing a refractive index of each portion used in simulation.

As illustrated in FIG. 9, the substrate 5 is omitted in the simulation model SM. The simulation model SM further includes a first intermediate layer 51 and a second intermediate layer 52. The first intermediate layer 51 is provided between the first electrode 11 and the insulating layer 40. The first intermediate layer 51 includes, for example, metal materials such as Al, Ag, and the like. The first intermediate layer 51 functions as, for example, an adhesive metal layer that strengthens the adhesion of the first electrode 11 and the insulating layer 40. The second intermediate layer 52 is provided between the second electrode 12 and the substrate 5 not shown in the drawing. The second intermediate layer 52 extends, for example, between the insulating layer 40 and the substrate 5. The second intermediate layer includes, for example, metal materials such as Al, Ag, and the like. The second intermediate layer 52 functions as, for example, an adhesive metal layer that strengthens the adhesion of the second electrode 12 and the substrate 5 and the adhesion of the insulating layer 40 and the substrate 5.

In the simulation, the emission wavelength was 450 nm. The material of the first semiconductor layer 10 was GaN. The refractive index of each portion is shown in FIG. 10. The width of the first electrode 11 (length of the X-axis direction) was 10 μm. The length of a portion contacting the first semiconductor layer 10 of the insulating layer 40 was 8 μm. The material of the insulating layer 40 was $SiO_2$. Further, various optical characteristics of the first electrode 11 and the second electrode 12 were adjusted to make the vertical reflectivity of the first electrode 11 to be 20% and the vertical reflectivity of the second electrode 12 to be 92%.

The diffraction grating was a one dimensional structure parallel to the extending direction (Y-axis direction) of the first electrode 11, and the cycle (interval P1) was from 100 nm ($\Lambda=0.552\lambda$) to 800 nm ($\Lambda=4.4\lambda$). The depth of the diffraction grating (length of the Z-axis direction of the convex portion 10m) was 60 nm. The unevenness 10v of the second face 10b was a random unevenness formed by a KOH wet etching. In the first electrode 11, a distance of the X-axis direction between one portion extending in the Y-axis direction and one other portion extending in the Y-axis direction (distance between the thin line electrodes) was 100 μm. The thickness of the first semiconductor layer 10 was 1 μm. However, by adjusting a GaN absorption coefficient, the distance between the thin line electrodes was equivalent to 200 μm, and the thickness of the first semiconductor layer 10 was equivalent to 2 μm. Note that by incorporating folded symmetry, ¼ of the space of the thin line electrode cycle was used as the analysis region.

Figure 11A:
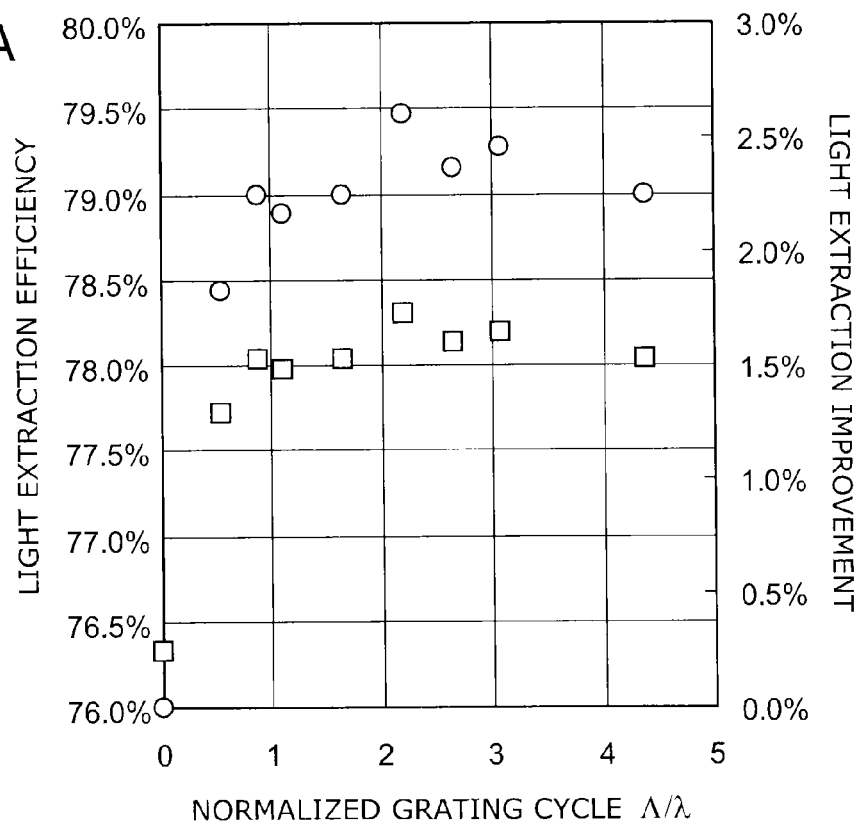
FIGS. 11A and 11B are graphs showing an example of simulation results.
Figure 11B:
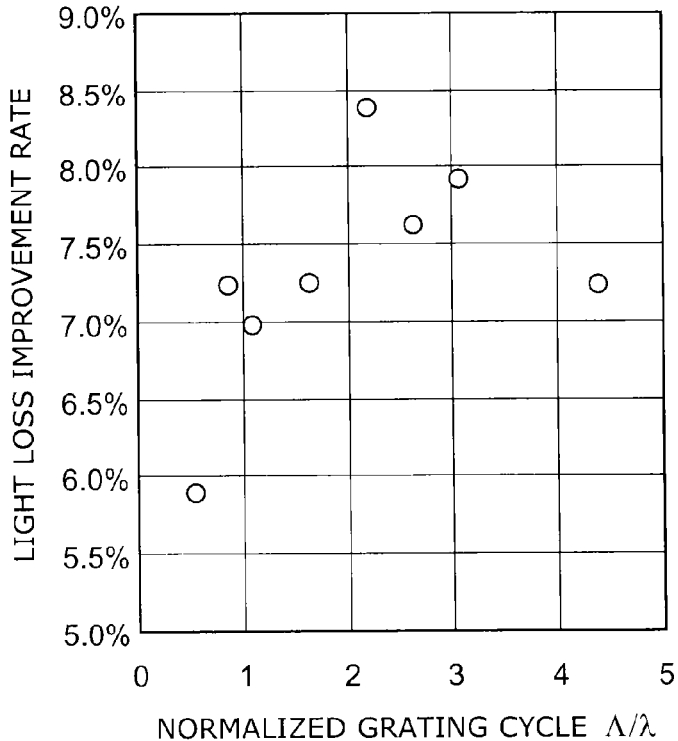

FIGS. 11A and 11B are graphs showing an example of simulation results.

In FIG. 11A, a square marker corresponds to the light extraction efficiency (left side vertical axis), and a circular marker corresponds to light extraction improvement rate (right side vertical axis).

As shown in FIG. 11A, with the current conditions, efficiency is highest around $\Lambda=2\lambda$. Meanwhile, it is understood that efficiency is significantly reduced at $0.55\lambda$, and the same effect can be achieved by shortening the cycle more than this. Meanwhile, a large reduction in efficiency is not seen at $\Lambda=3\lambda$. However, the improvement in light extraction is mainly caused by that fact that the thickness of the first semiconductor layer 10 directly above the first electrode 11 was relatively thinner due to erosion in the diffraction grating structure so there was little diffraction grating effect. When thicker than the first semiconductor layer 10, it is anticipated that it will be a region with reduced improvement rate. The above results suggest that $\frac{1}{2}\lambda<\Lambda<4\lambda$ is appropriate.

As shown in FIGS. 11A and 11B, it is understood that an improvement of 2.5% or more of light extraction efficiency is possible with the conditions currently presented. This indicates a suppression of 8% or more of internal loss and is a very meaningful effect.

Next, a manufacturing method of the semiconductor light emitting element 110 will be described.

FIGS. 12A to 12I are cross-sectional diagrams schematically illustrating a process order of a manufacturing method of a semiconductor light emitting element according to an embodiment.

Figure 13:
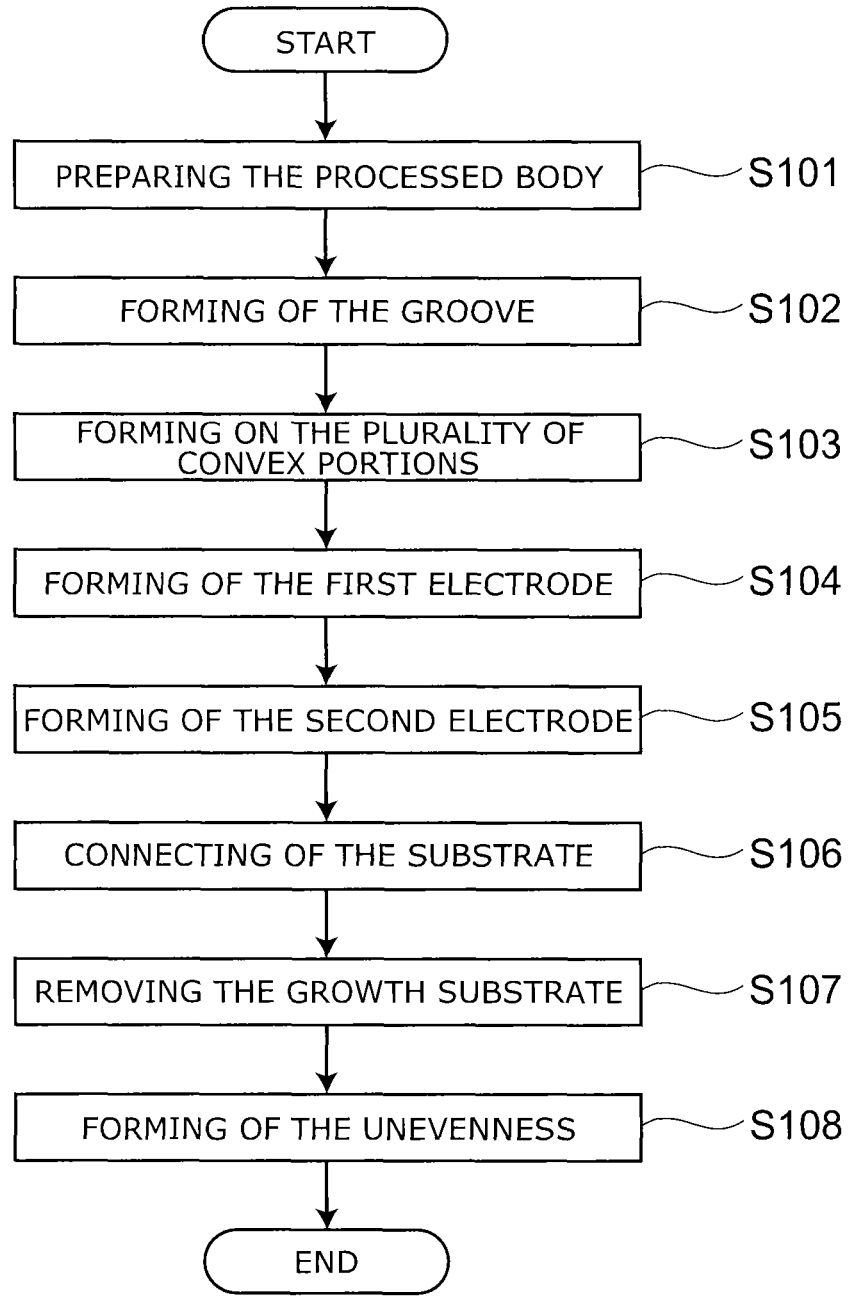
FIG. 13 is a flowchart illustrating the method for manufacturing a semiconductor light emitting element according to an embodiment.

FIG. 13 is a flowchart illustrating the method for manufacturing a semiconductor light emitting element according to an embodiment.

Figure 12A:
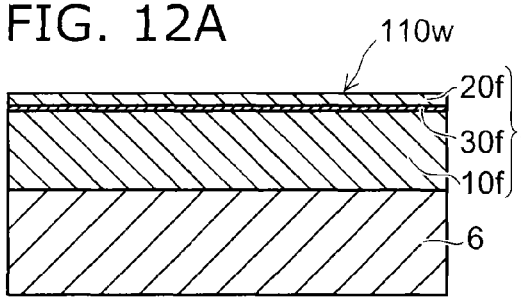
FIGS. 12A to 12I are cross-sectional diagrams schematically illustrating a process order of a manufacturing method of a semiconductor light emitting element according to an embodiment.

As illustrated in FIG. 12A and step S101 of FIG. 13, a processed body 110w is first prepared in the manufacturing of the semiconductor light emitting element 110. The processed body 110w includes a growth substrate 6 and a stacked film SF. The stacked film SF is stacked on the growth substrate 6 in the Z-axis direction. The stacked film SF includes a first semiconductor film 10f of the first conductivity type that becomes the first semiconductor layer 10, a second semiconductor film of the second conductivity type that becomes the second semiconductor layer 20, and a light emitting film 30f that becomes the light emitting layer 30.

In the processed body 110w, the first semiconductor film 10f is provided between the growth substrate 6 and the second semiconductor film 20f. The light emitting film 30f is provided between the first semiconductor film 10f and the second semiconductor film 20f. A sapphire substrate, a silicon substrate, or the like is used, for example, for the growth substrate 6.

The preparation of the processed body 110w includes, for example, the formation of the processed body 110w by the formation of the first semiconductor film 10f on the growth substrate 6, the formation of the light emitting film 30f on the first semiconductor film 10f, and the formation of the second semiconductor film 20f on the light emitting film 30f.

Figure 12F:
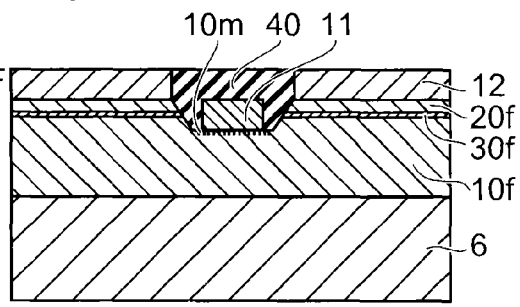
Figure 12B:
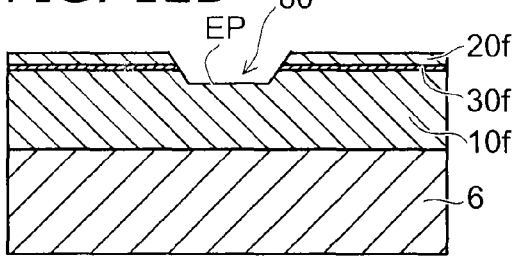

As illustrated in FIG. 12B and step S102 of FIG. 13, for example, one portion of the second semiconductor film 20f, one portion of the light emitting film 30f, and one portion of the semiconductor film 10f are removed by a photolithography process and an etching process. In this manner, a groove 60 for forming the first electrode 11 is formed on the stacked film SF. The groove 60 exposes one portion of the first semiconductor film 10f. The portion exposed by the groove 60 (referred to below as the exposed portion EP) becomes the first portion 10p on the first semiconductor layer 10.

Figure 12G:
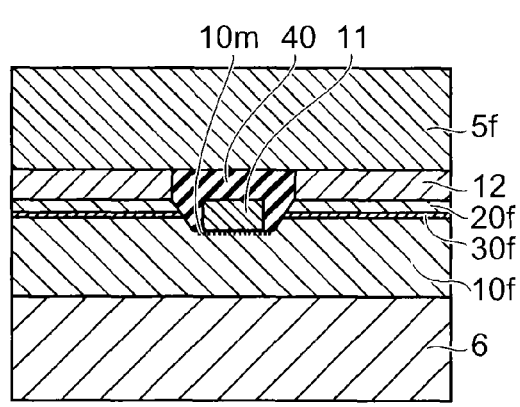
Figure 12C:
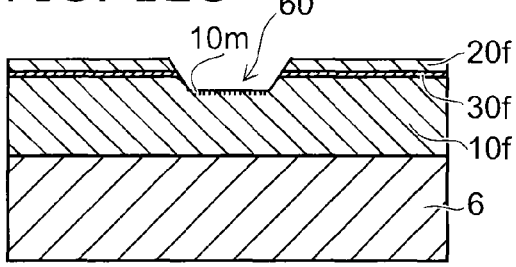

As illustrated in FIG. 12C and step S103 of FIG. 13 the plurality of convex portions are provided on the exposed portion EP on the first semiconductor film 10f. The plurality of convex portions 10m, for example, are formed by transcribing the diffraction grating pattern on the exposed portion EP by a photolithography process and etching the first semiconductor film 10f. At this time, the plurality of convex portions 10m are formed so that the interval of each of the plurality of convex portions 10m is no less than 0.5 and no more than 4 times the wavelength of the light emitted from the light emitting film 30f (light emitting layer 30).

With this method, the shape of the diffraction grating can be formed sharply. For example, a strong diffraction can be obtained with the plurality of convex portions 10m. However, it is necessary to use projection exposure or beam imaging (laser imaging, electron beam imaging and the like) to perform patterning on the wedge 60.

Figure 12H:
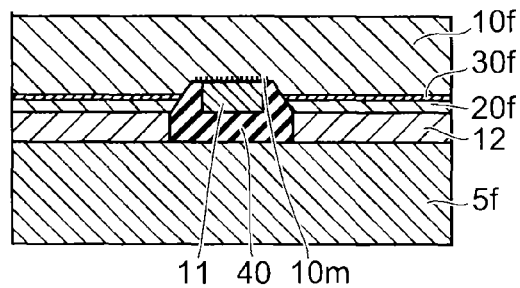
Figure 12D:
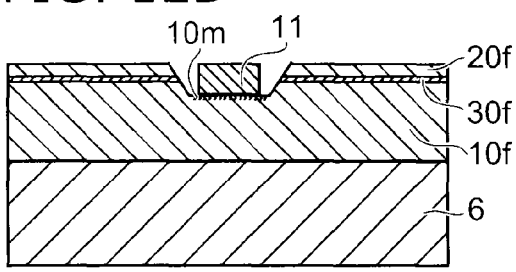

As illustrated in FIG. 12D and in step S104 of FIG. 13, for example, the first electrode 11 is formed on the exposed portion EP by a film formation process, a photolithography process, or an etching process. In other words, the first electrode 11 is formed on the plurality of convex portions 10m. The first electrode 11 is electrically connected to the first semiconductor film 10f.

Figure 12I:
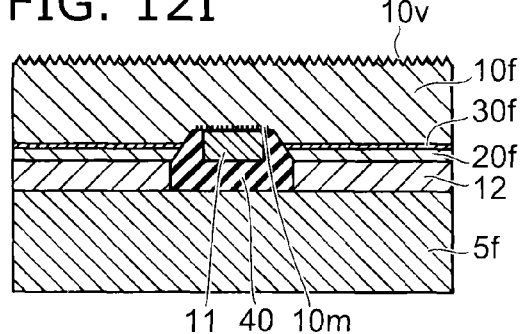
Figure 12E:
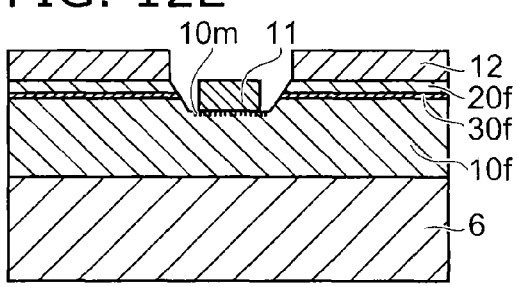

As illustrated in FIG. 12E and step S105 of FIG. 13, for example, the second electrode 12 is formed on the second semiconductor layer 20f by a film formation process, a photolithography process, or an etching process. The second electrode 12 is electrically connected to the second semiconductor film 20f.

As illustrated in FIG. 12F, for example, the insulating layer 40 is formed by a film formation process, a photolithography process, or an etching process. The insulating layer 40 is formed, for example, by embedding an insulating material in the groove 60.

As illustrated in FIG. 12G and step S106 of FIG. 13, a supporting substrate 5f that becomes the substrate 5 is connected on the second electrode 12 and on the insulating layer 40. The supporting substrate 5f is connected to the second electrode 12 and insulating layer 40 by AuSn soldering.

As illustrated if FIG. 12H and step S107 of FIG. 13, the growth substrate 6 is separated from the first semiconductor film 10f. The growth substrate 6 is separated, for example, from a laser lift-off or the like.

As illustrated in FIG. 12I and step 108 of FIG. 13, the unevenness 10v is formed on a surface (surface on the opposite side of the light emitting film 30f) of the first semiconductor film 10f by an etching process or the like.

Afterwards, for example, the stacked film SF and the supporting substrate 5f are separated from each element by a dicing process. For example, the substrate 5 is formed from the supporting substrate 5f, the first semiconductor layer 10 is formed from the first semiconductor film 10f, the second semiconductor layer 20 is formed from the second semiconductor film 20f, and the light emitting layer 30 is formed from the light emitting film 30f.

Thereby, a semiconductor light emitting element 110 is completed.

Figure 14A:
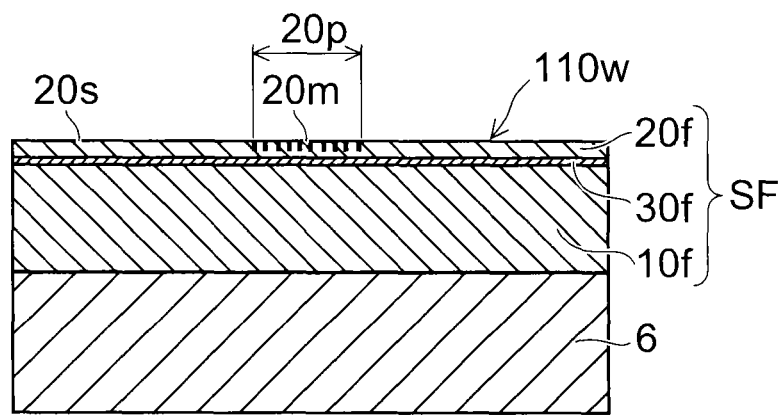
FIGS. 14A and 14B are cross-sectional diagrams schematically illustrating a process order of another manufacturing method of a semiconductor light emitting element according to an embodiment.
Figure 14B:
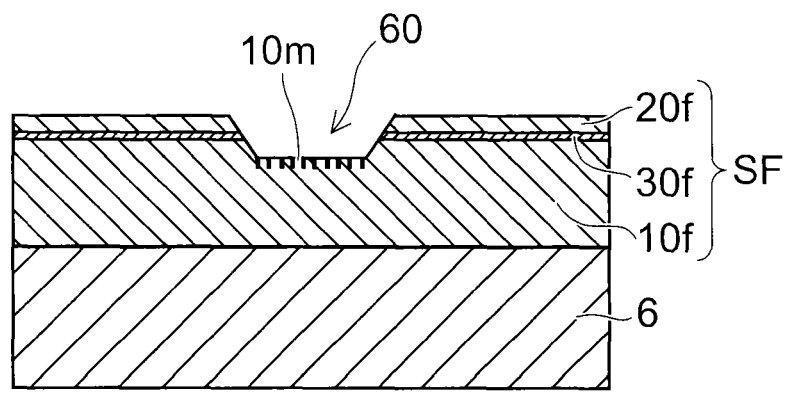

FIGS. 14A and 14B are cross-sectional diagrams schematically illustrating a process order of another manufacturing method of a semiconductor light emitting element according to an embodiment.

Figure 15:
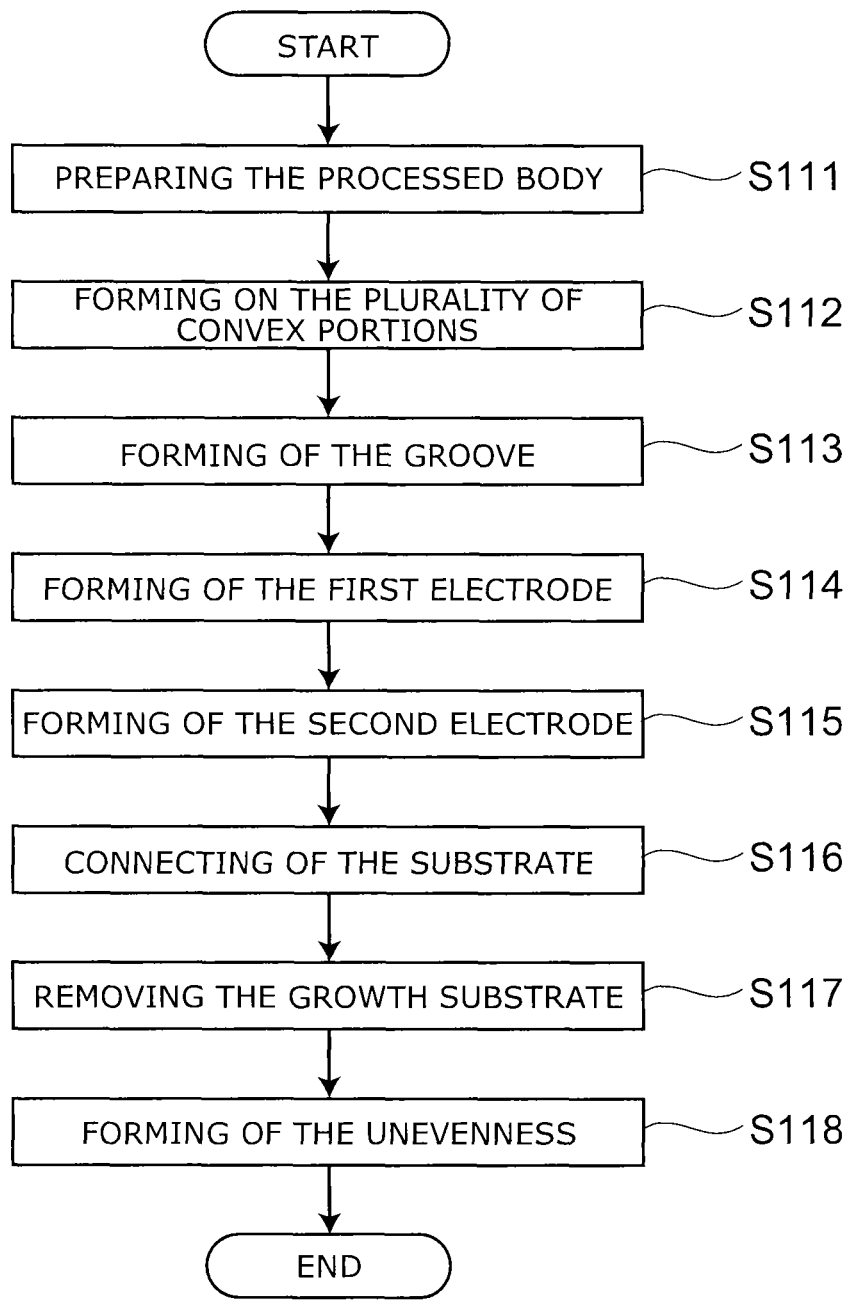
FIG. 15 is a flowchart illustrating another method for manufacturing a semiconductor light emitting element according to an embodiment.

FIG. 15 is a flowchart illustrating another method for manufacturing a semiconductor light emitting element according to an embodiment.

As shown in step S111 of FIG. 15, in this example, the processed body 110w is first prepared as described above.

As illustrated in FIG. 14A and step S112 of FIG. 15, for example, a plurality of convex portions 20m are formed on a surface 20s (face on the opposite side of the light emitting film 30f) of the second semiconductor film 20f by a photolithography process, or an etching process. Each of the plurality of convex portions 20m, for example, is formed on a portion 20p of the surface 20s. The portion 20p of the surface 20s is a portion that overlaps a region that forms the first electrode 11 of the first semiconductor film 10f on the second semiconductor film 20f. At this time, the plurality of convex portions 20m are formed so that the interval of each of the plurality of convex portions 20m is no less than 0.5 and no more than 4 times the wavelength of the light emitted from the light emitting film 30f (light emitting layer 30).

As illustrated in FIG. 14B and step S113 of FIG. 15, for example, the groove 60 is formed by a photolithography process or an etching process. At this time, the plurality of convex portions 10m are formed on the exposed portion EP by transcribing the shape of the plurality of convex portions 20b on the exposed portion EP.

As described in the example above, the formation of the first electrode 11, the formation of the second electrode 12, the formation of the insulating layer 40, the connection of the supporting substrate 5f, the separation of the growth substrate 6, and the formation of the unevenness 10v are performed below (step S114 to step S118 of FIG. 15). In this manner, the semiconductor light emitting element 110 can be formed in this example.

With this method, the patterning of the diffraction grating can be performed on a smooth surface (for example, the surface 20s of the second semiconductor film 20). Therefore, in addition to the usual projection exposure and beam imaging, contact exposure, near-field exposure, nano-imprint technology and the like can be used. In other words, in this example, it is simpler to perform the patterning of the diffraction grating, for example, when compared to forming the groove 60 beforehand.

However, in this example, the diffraction grating structure is somewhat dull when compared to forming the groove 60 beforehand. Meanwhile, when the diffraction grating structure is not sharp, for example, light absorption in the first electrode 11 can be suppressed. For example, an increase of light loss due to localized plasmon can be suppressed. Also, in this example, dry etching, for example, is used for the formation of the groove 60. In this manner, for example, the shape of the plurality of convex portions 20m can be appropriately transcribed on the first semiconductor layer 10f. The shape of the diffraction grating structure can be sufficiently maintained.

When manufacturing the flip chip structured semiconductor light emitting element 115, for example, dicing is performed after the steps up to the formation of the second electrode 12 are performed. By this, the semiconductor light emitting element 115 can be manufactured. In this case, for example, the substrate 5 is formed from the growth substrate 6.

According to this embodiment, a semiconductor light emitting element that can improve light extraction efficiency and a method for manufacturing the same can be provided.

Note that in this specification, the term, "nitride semiconductor" includes semiconductors of all compositions wherein composition proportions of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductor" shall also be understood to include semiconductors further including group V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their narrowest sense, but rather substantially perpendicular or parallel so as to take factors into account such as variations in manufacturing processes and the like. In the specifications, "provided on" also includes being provided with another element inserted in between in addition to being provided with direct contact. "Stacked" also includes being stacked with another element inserted in between in addition to being stacked together in contact. "Opposing" also includes opposing with another element inserted in between in addition to directly opposing. In the specifications, "electronically connected" includes being connected via another conductive member and the like in addition to being directly connected.

Embodiments of the invention with reference to examples were described above. However, the embodiments of the invention are not limited to these examples. For example, if a person with ordinary skill in the art to which the invention pertains selects as appropriate each element from the publicly-known range for the specific configuration of the substrate, the stacked body, the first semiconductor layer, the second semiconductor layer, the light emitting layer, the first electrode, the second electrode, the stacked film, the first semiconductor film, the second semiconductor film, the light emitting film, and the like, that are included in the semiconductor light emitting element, and implements the invention in the same way, it is included within the invention as long as the same effect can be obtained.

Additionally, combinations of elements from two or more of the examples are also included in the scope of the invention, provided that they are technically possible and do not depart from the spirit of the invention.

Beside such cases, all semiconductor light emitting elements and methods for manufacturing the same based on the embodiments of the invention described above that are obtainable through appropriate design modifications by a person skilled in the art shall be understood to fall within the scope of the invention, provided such semiconductor light emitting elements and methods for manufacturing the same do not depart from the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
a first semiconductor layer of a first conductivity type, the first semiconductor layer includes a first region and a second region;
a second semiconductor layer of a second conductivity type, the second semiconductor layer being apart from the second region in a first direction, the first direction crossing a direction from the first region toward second region;
a light emitting layer provided between the second region and the second semiconductor layer in the first direction, the light emitting layer being configured to emit light having a wavelength; and
a first electrode electrically connected with the first semiconductor layer,
the first region having a first face being provided with a plurality of convex portions,
the first electrode overlapping the convex portions in the first direction,
a distance in a second direction between a first center and a second center being not less than 0.5 times and not more than 4 times the wavelength, the second direction being perpendicular to the first direction, the first center being a center of one of the convex portions in the second direction, the second center being a center of another one of the convex portions in the second direction, the another one of the convex portions being most proximal to the one of the convex portions among the convex portions.

2. The element according to claim 1, further comprising a substrate; and
a second electrode electrically connected with the second semiconductor layer,
the first electrode being disposed between the first region and the substrate in the first direction,
the second semiconductor layer being provided between the second region and the substrate, and
the second electrode being provided between the second semiconductor layer and the substrate.

3. The element according to claim 2, wherein the first electrode contacts the convex portions.

4. The element according to claim 2, wherein the one of the convex portions includes a material same as a material included in the first semiconductor layer.

5. The element according to claim 2, wherein a material of the one of the convex portions is different from a material of the first semiconductor layer.

6. The element according to claim 5, wherein a refractive index of the one of the convex portions is lower than a refractive index of the first semiconductor layer.

7. The element according to claim 2, wherein
the first electrode extends in a third direction crossing the first direction and the second direction, and
each of the convex portions extends in the third direction and the convex portions are arranged the second direction.

8. The element according to claim 2, wherein the convex portions are arranged in a lattice shape.

9. The element according to claim 2, wherein
the second semiconductor layer has an opposing surface facing the second electrode, and
a surface roughness of the opposing surface is less than a surface roughness of the first face provided with a plurality of convex portions.

10. The element according to claim 9, wherein the second electrode contacts the opposing surface.

11. The element according to claim 2, wherein
the substrate has conductivity, and
the second electrode is electrically connected with the substrate.

12. The element according to claim 11, further comprising an insulating layer provided between the first electrode and the substrate.

13. The element according to claim 12, wherein a portion of the insulating layer faces the first region.

14. The element according to claim 2, wherein the substrate is light reflective.

15. The element according to claim 2, wherein the first electrode and the second electrode are light reflective.

16. The element according to claim 2, wherein the wavelength is not less than 400nm and not greater than 500nm.

17. The element according to claim 2, wherein a part of the first electrode is provided between the one of the convex portions and another one of the convex portions in the second direction.

18. The element according to claim 2, wherein a pitch the convex portions in the second direction is not less than 0.5 times and not more than 4 times the wavelength.

19. The element according to claim 1, further comprising a substrate;
the first semiconductor layer being provided between the substrate and the light emitting layer.

20. The element according to claim 19, wherein the substrate has optical transparency.

* * * * *